United States Patent
Song et al.

(10) Patent No.: US 10,386,024 B2
(45) Date of Patent: Aug. 20, 2019

(54) WAVELENGTH CONVERSION MEMBER HAVING TWO DIFFERENT WAVELENGTH CONVERTING MATERIALS AND BACKLIGHT UNIT INCLUDING THE SAME

(71) Applicant: Samsung Display Co., Ltd., Yongin-si, Gyeonggi-do (KR)

(72) Inventors: Si Joon Song, Suwon-si (KR); Yong Hoon Kwon, Hwaseong-si (KR); Won Jin Kim, Hwaseong-si (KR); Woo Suk Seo, Yongin-si (KR); Young Hye Son, Yongin-si (KR); Kwang Wook Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/870,725

(22) Filed: Jan. 12, 2018

(65) Prior Publication Data
US 2018/0210125 A1    Jul. 26, 2018

(30) Foreign Application Priority Data

Jan. 23, 2017    (KR) ........................ 10-2017-0010302

(51) Int. Cl.
*F21V 8/00*    (2006.01)
*F21K 9/64*    (2016.01)
(Continued)

(52) U.S. Cl.
CPC .............. *F21K 9/64* (2016.08); *C09K 11/642* (2013.01); *G02F 1/133615* (2013.01);
(Continued)

(58) Field of Classification Search
CPC ........ G02B 6/0023; G02B 6/0026; F21V 9/30; F21V 9/38; F21V 9/64; F21V 9/40
See application file for complete search history.

(56) References Cited

U.S. PATENT DOCUMENTS 8,294,168 B2    10/2012  Park et al.
8,362,684 B2    1/2013   Bawendi et al.
(Continued)

FOREIGN PATENT DOCUMENTS

KR    10-2013-0047510 A    5/2013
WO    WO 2012/105746 A1    8/2012
(Continued)

OTHER PUBLICATIONS

EPO Extended Search Report dated Apr. 26, 2018, for corresponding European Patent Application No. 18152028.9 (9 pages).

*Primary Examiner* — Robert J May
(74) *Attorney, Agent, or Firm* — Lewis Roca Rothgerber Christie LLP

(57) ABSTRACT

A wavelength conversion member includes: a first wavelength converter containing a first wavelength converting material; a second wavelength converter containing a second wavelength converting material different from the first wavelength converting material; a first container member providing a space for accommodating the first wavelength converter; and a second container member facing the first container member and providing a space for accommodating the second wavelength converter. The first container member and the second container member may be at least partially fusion-bonded with each other.

20 Claims, 15 Drawing Sheets

(51) Int. Cl.
*H01L 33/50* (2010.01)
*G02F 1/1335* (2006.01)
*G02F 1/35* (2006.01)
*C09K 11/64* (2006.01)

(52) U.S. Cl.
CPC .............. *G02F 1/353* (2013.01); *H01L 33/50* (2013.01); *H01L 33/504* (2013.01); *G02B 6/0023* (2013.01); *G02F 1/133609* (2013.01); *G02F 2001/133614* (2013.01); *G02F 2201/16* (2013.01); *G02F 2202/046* (2013.01); *G02F 2202/36* (2013.01)

(56) References Cited

U.S. PATENT DOCUMENTS

| | | | |
|---|---|---|---|
| 8,902,379 B2 * | 12/2014 | Park | G02F 1/133606 349/62 |
| 9,341,763 B1 * | 5/2016 | Fan | G02B 6/0026 |
| 9,412,905 B2 * | 8/2016 | Su | C09K 11/02 |
| 9,841,552 B2 * | 12/2017 | Achi | G02B 6/0068 |
| 9,874,675 B2 * | 1/2018 | Cho | G02B 6/0026 |
| 2013/0207073 A1 | 8/2013 | Bawendi et al. | |
| 2015/0192272 A1 * | 7/2015 | Berg | F21V 9/40 362/84 |
| 2016/0054503 A1 | 2/2016 | Fan | |
| 2016/0139319 A1 | 5/2016 | Fan | |

FOREIGN PATENT DOCUMENTS

| | | | |
|---|---|---|---|
| WO | WO 2013/012193 A2 | 1/2013 | |
| WO | WO 2013/012193 A3 | 1/2013 | |

\* cited by examiner

WAVELENGTH CONVERSION MEMBER HAVING TWO DIFFERENT WAVELENGTH CONVERTING MATERIALS AND BACKLIGHT UNIT INCLUDING THE SAME

CROSS-REFERENCE TO RELATED APPLICATION

This application claims priority to Korean Patent Application No. 10-2017-0010302, filed on Jan. 23, 2017, in the Korean Intellectual Property Office, the entire content of which is incorporated herein by reference.

BACKGROUND

1. Field

One or more aspects of one or more embodiments of the present invention relate to a wavelength conversion member and a backlight unit including the wavelength conversion member.

2. Description of the Related Art

The importance of a display device, for example, a liquid crystal display device has increased with the development of media and electronic methods of communication. The display panel of a liquid crystal display device commonly includes two substrates, each provided with an electric field-generating electrode, and a liquid crystal layer disposed (e.g., positioned) between the two substrates. The liquid crystal display device generally requires a backlight unit for providing light to the display panel, because the image on the liquid crystal display is generated by rearranging the liquid crystals in the liquid crystal layer using the electric field-generating electrode, to adjust the amount of light passing through the display panel.

Generally, the backlight unit may include a light source for emitting light and a light guide plate for guiding the light provided from the light source. Since the light provided from the backlight unit passes through the display panel and contributes to displaying the image, the color purity of the light provided from the backlight unit may be an important factor in determining the display quality of the liquid crystal display device. Thus, there is a need to develop a method for further improving the color purity of the light provided by the backlight unit.

SUMMARY

White light emitted by the light source may include intrinsic wavelengths of red, green, and blue. However, white light emitted by a comparative light source may be mixed with light in an unintentional (e.g., undesirable) wavelength band, which may cause degradation of display quality of the display device.

One or more aspects of one or more embodiments of the present invention are directed toward a wavelength conversion member which can generate high-purity white light.

One or more aspects of one or more embodiments of the present invention are directed toward a backlight unit, which can provide high-purity white light, which can minimize (or reduce) the light loss between a wavelength conversion member and a light guide plate by accurately maintaining the alignment state between the wavelength conversion member and the light guide plate even when an external impact is applied, and which can maximize (or improve) color conversion efficiency.

However, aspects of embodiments of the present invention are not restricted to the one set forth herein. The above-described aspect and other aspects of the present invention will become more apparent to one of ordinary skill in the art to which the present invention pertains by referencing the detailed description of the present invention given below.

According to an example embodiment of the invention, there is provided a wavelength conversion member. The wavelength conversion member may include: a first wavelength converter extending in a first direction and containing a first wavelength converting material; a second wavelength converter extending in the first direction and containing a second wavelength converting material different from the first wavelength converting material; a first container member extending in the first direction and providing a space for accommodating the first wavelength converter; and a second container member extending in the first direction and providing a space for accommodating the second wavelength converter, wherein each of the first container member and the second container member has a first side and a second side, wherein the second container member is adjacent to the first container member in a second direction, crossing the first direction, the first side of the first container member and the second side of the second container member facing each other and together forming a contact surface between the first container member and the second container member, and wherein the first container member and the second container member are at least partially fusion-bonded to each other.

In an example embodiment, the contact surface between the first container member and the second container member may include: a first portion where there is a physical boundary between the first container member and the second container member; a second portion where there is substantially nophysical boundary between the first container member and the second container member; and a third portion overlapping the first wavelength converter, and wherein the first portion, the second portion, and the third portion may be aligned along a third direction, crossing the first and second directions, and a part of the first portion may be located between the second portion and the third portion.

In an example embodiment, the part of the first portion located between the second portion and the third portion may have a width of 50 μm or more, the second portion may have a width of 60 μm to 120 μm, a seed-like structure may exist in the vicinity of the second portion, and the seed-like structure may have an elongated shape having a major axis and a minor axis.

In an example embodiment, the first wavelength converter may further comprise metal particles selected from aluminum oxide particles and silicon oxide particles, and the second wavelength converter may not contain metal particles.

In an example embodiment, the first wavelength converter may be surrounded by the first container member, and the second wavelength converter may be surrounded by the second container member.

In an example embodiment, the first side of the first container member may have a first concave groove for accommodating the first wavelength converter, and the second side of the second container member, facing the first container member, may have a second concave groove for accommodating the second wavelength converter.

In an example embodiment, a gap may be formed between the first wavelength converter and the second wavelength converter by the first and second concave grooves.

In an example embodiment, the wavelength conversion member may further comprise: a first cover member adjacent to the second side of the first container member, opposite the first side of the first container member, and sealing the first wavelength converter; and a second cover member adjacent to the first side of the second container member, opposite the second side of the second container member, and sealing the second wavelength converter, wherein the second side of the first container member may have a first concave groove for accommodating the first wavelength converter, and the first side of the second container member may have a second concave groove for accommodating the second wavelength converter.

In an example embodiment, the wavelength conversion member may further comprise: a cover member adjacent to the second side of the first container member, opposite the first side of the first container member, and sealing the first wavelength converter, wherein the second side of the first container member may have a first concave groove for accommodating the first wavelength converter, and the second side of the second container member, facing the first side of the first container member, may have a second concave groove for accommodating the second wavelength converter, and the second wavelength converter may be surrounded by the first side of the first container member and the first side of the second container member, opposite the second side of the second container member.

According to another example embodiment of the invention, a wavelength conversion member, comprising: a first glass extending in a first direction and having a first side and a second side, opposite the first side; a second glass extending in a first direction and having a first side and a second side, opposite the first side, the second glass being adjacent to the first glass in a second direction, crossing the first direction, and at least partially in direct contact with the first glass, the first side of the first glass and the second side of the second glass facing each other and together forming a contact surface between the first glass and the second glass; a first wavelength converter interposed in the second glass adjacent to the contact surface between the first glass and the second glass, the first wavelength converter containing a first wavelength converting material; and a second wavelength converter interposed in the second glass adjacent to the first side of the second glass, the second wavelength converter containing a second wavelength converting material different from the first wavelength converting material.

In an example embodiment, the first glass and the second glass may be at least partially fusion-bonded to each other, and wherein the contact surface between the first glass and the second glass may include: a first portion where there is a physical boundary between the first glass and the second glass; a second portion where there is substantially no physical boundary between the first glass and the second glass; and a third portion overlapping the first wavelength converter, and wherein a part of the first portion may be located between the second portion and the third portion.

In an example embodiment, the first side of the first glass may be substantially flat, the second side of the second glass, facing the first glass, may have a first concave groove, the first side of the second glass may have a second concave groove, the first wavelength converter may be inserted in the first concave groove, and the second wavelength converter may be inserted in the second concave groove.

In an example embodiment, a gap may be formed between the first glass and the first wavelength converter by the first concave groove.

In an example embodiment, the wavelength conversion member may further comprise: a third glass adjacent to the second wavelength converter in the second direction and at least partially in direct contact with the second glass, wherein the first side of the first glass may be substantially flat, the second side of the second glass, facing the first glass, may have a first concave groove, the first side of the second glass may have a second concave groove, and a side of the third glass facing the second glass may be substantially flat, and wherein the first wavelength converter may be inserted in the first concave groove, and the second wavelength converter may be inserted in the second concave groove.

In an example embodiment, the wavelength conversion member may further comprise a third glass between the first wavelength converter and the second wavelength converter and at least partially in direct contact with the second glass, wherein the first side of the first glass may be substantially flat, a second side of the second glass, facing the first glass, may have a first concave groove, a first side of the third glass, facing the second wavelength converter, may have a second concave groove, the first wavelength converter may be inserted in the first concave groove, and the second wavelength converter may be inserted in the second concave groove.

In an example embodiment, the first side of the first glass may have a concave groove, a second side of the second glass, facing the first glass, may be substantially flat, and the first wavelength converter may be inserted in the concave groove.

In an example embodiment, the first wavelength converter and the second glass may directly face each other, but a gap may be formed between the first wavelength converter and the second glass.

According to an example embodiment of the invention, there is provided a backlight unit. The backlight unit may include: a light guide plate having a light incoming surface; a light source adjacent to the light incoming surface of the light guide plate and configured to emit light toward the light guide plate; and a wavelength conversion member between the light guide plate and the light source and including a red wavelength converter containing a red wavelength converting material, a green wavelength converter containing a green wavelength converting material, a first glass providing a space for accommodating the red wavelength converter, and a second glass providing a space for accommodating the green wavelength converter, the second glass being at least partially in direct contact with the first glass, wherein light emitted from the light source sequentially passes through the red wavelength converter and the green wavelength converter to be incident on the light incoming surface.

In an example embodiment, the second glass and the light guide plate may be coupled with each other by at least partial fusion-bonding.

In an example embodiment, the light emitted by the light source may be blue light, the red wavelength converter may further contain metal particles selected from aluminum oxide particles and silicon oxide particles, and the green wavelength converter may do not contain metal particles.

BRIEF DESCRIPTION OF THE DRAWINGS

The above-described aspect and other aspects and features of the present invention will become more apparent by describing in more detail example embodiments of the present disclosure, with reference to the attached drawings, in which.

DETAILED DESCRIPTION

Figure 1:
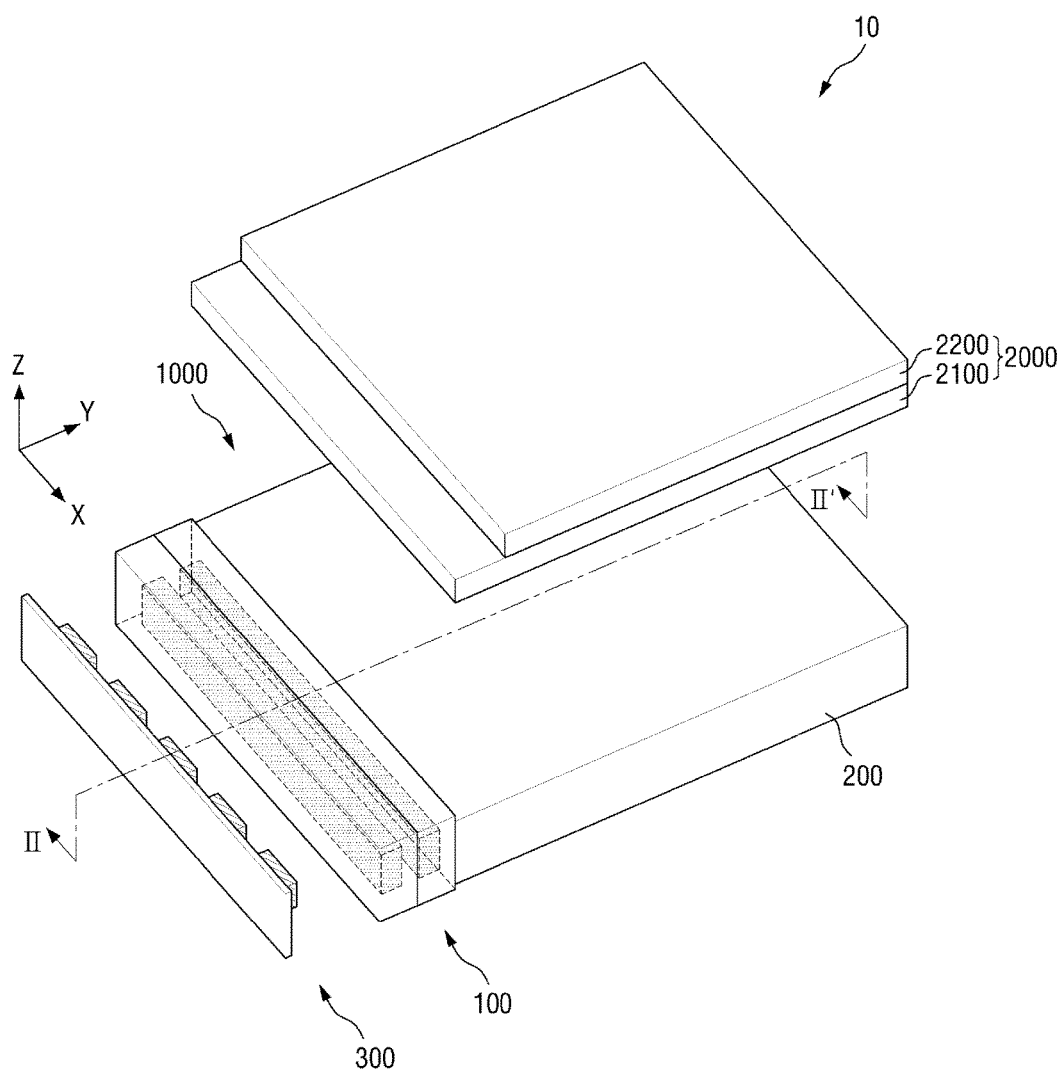
FIG. 1 is a perspective view of a display device according to an embodiment of the present invention.

Features of the present invention and methods of accomplishing the same may be understood more readily by reference to the following detailed description of example embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims and equivalents thereof.

It will be understood that when an element or layer is referred to as being "on," "connected to" or "coupled to" another element or layer, the element or layer can be directly on, connected or coupled to another element or layer, or intervening elements or layers may be present. In contrast, when an element is referred to as being "directly on," "directly connected to" or "directly coupled to" another element or layer, there are no intervening elements or layers present. As used herein, "connected" may refer to elements being physically, electrically and/or fluidly connected to each other.

Like numbers refer to like elements throughout. As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the example term "below" can encompass both a top and a bottom orientation of the corresponding element. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. "At least one" is not to be construed as limiting "a" or "an." "Or" means "and/or."

In this specification, the first direction X may refer to any one direction in the plane, the second direction Y may refer to a direction intersecting the first direction X in the plane, and Z may refer to a direction perpendicular to the plane.

Hereinafter, embodiments of the present invention will be described with reference to the attached drawings.

Figure 2:
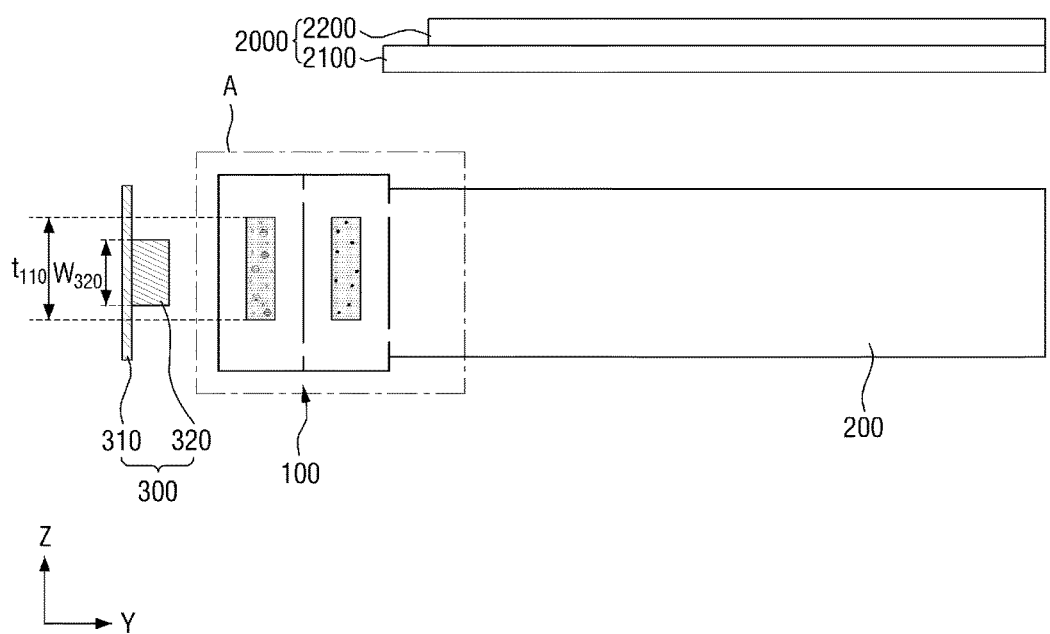
FIG. 2 is a sectional view taken along the line II-II' of FIG. 1.
Figure 3A:
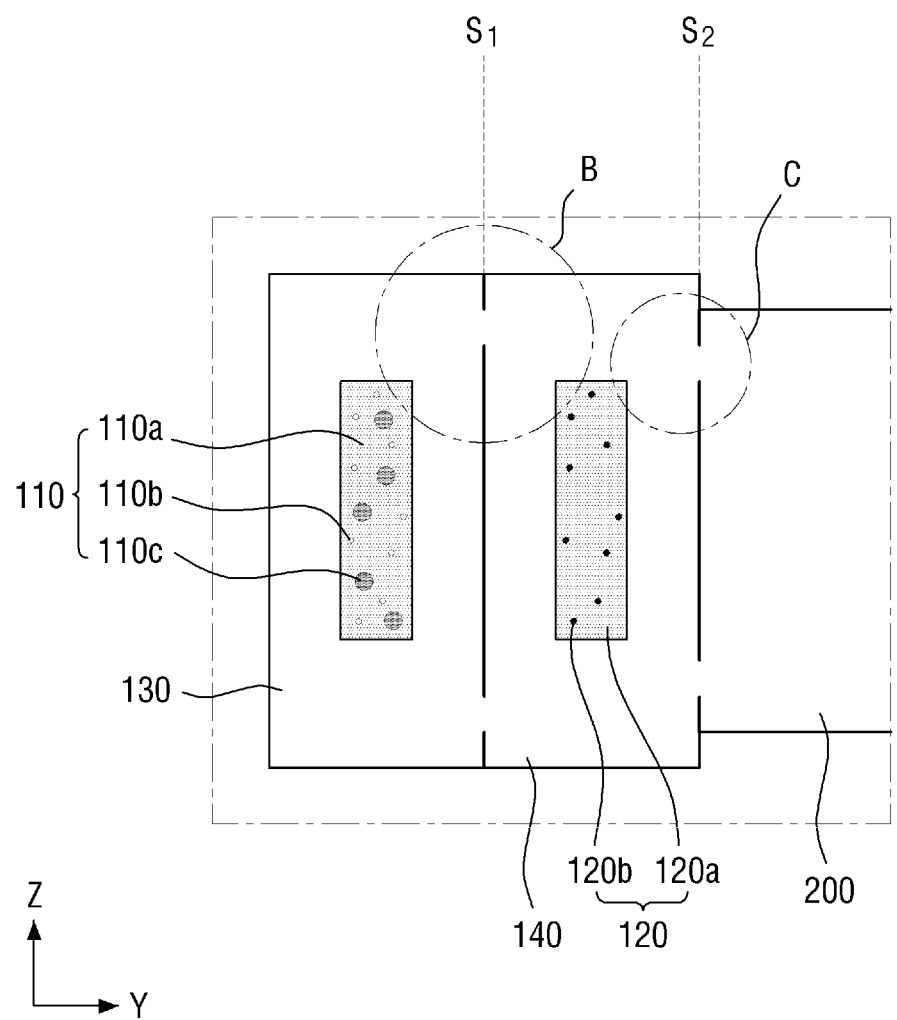
FIG. 3A is an enlarged sectional view of portion A of FIG. 2.
Figure 3B:
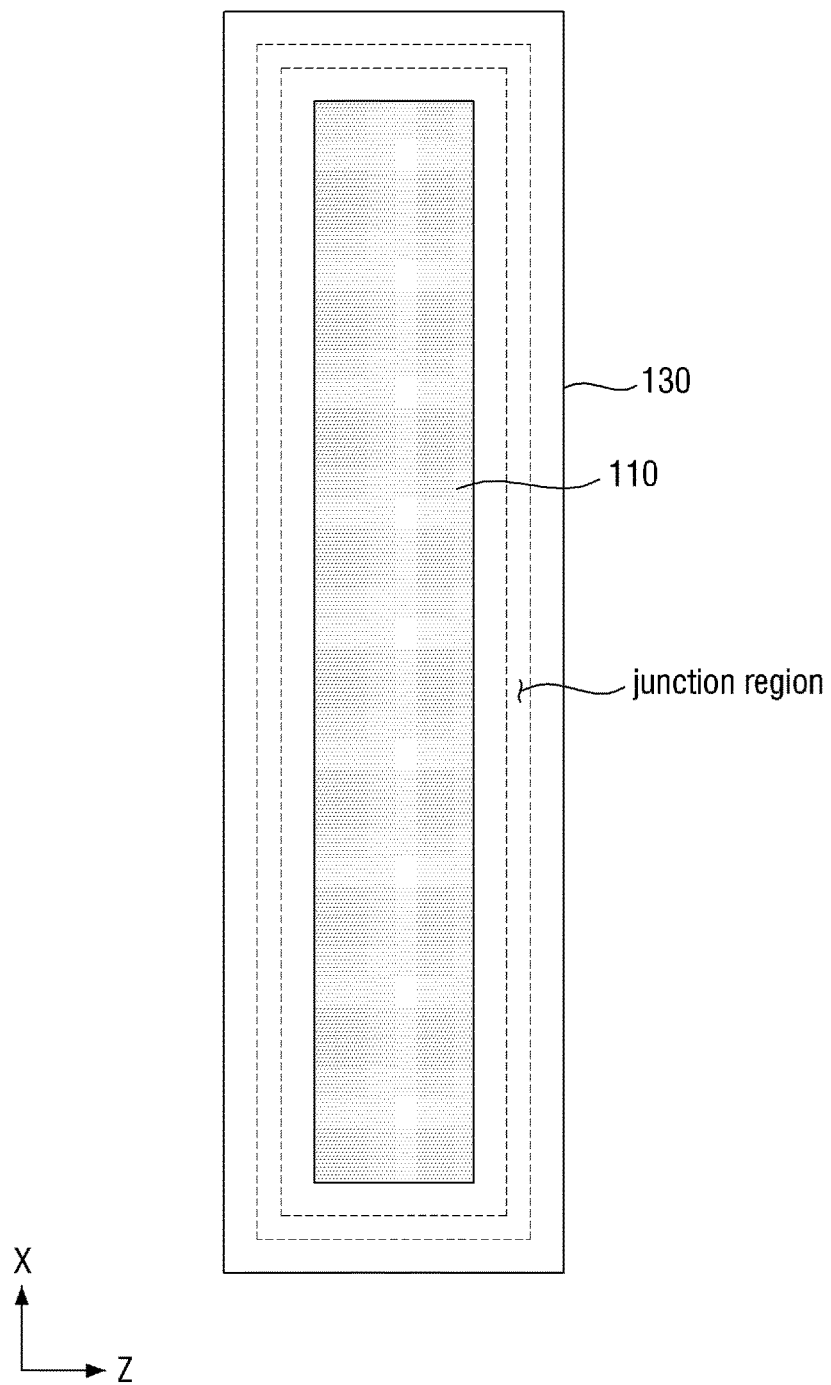
FIG. 3B is a plane view of the first glass of FIG. 2

FIG. 1 is a perspective view of a display device according to an embodiment of the present invention. FIG. 2 is a sectional view taken along the line II-II' of FIG. 1. FIG. 3A is an enlarged sectional view of portion A of FIG. 2. FIG. 3B is a plane view of the first glass of FIG. 2

Referring to FIGS. 1 to 3B, the display device 10 according to this embodiment includes a backlight unit 1000 and a display panel 2000 disposed (e.g., positioned) on the backlight unit 1000. The display panel 2000 may be an element capable of realizing image display (e.g., capable of displaying images). For example, the display panel 2000 may be a liquid crystal display panel, an organic light-emitting display panel, a plasma display panel, or the like.

In an example embodiment where the display panel 2000 is a liquid crystal display panel, the display panel 2000 may include a lower substrate 2100 and an upper substrate 2200 facing each other, and a liquid crystal layer interposed between the lower substrate 2100 and the upper substrate 2200. The lower substrate 2100 and the upper substrate 2200 may each independently include a plurality of pixel electrodes, a switching element for controlling the pixel electrodes, a gate line for transmitting a signal for controlling the switching element, and a data line. The planar area of the lower substrate 2100 may be larger than the planar area of the upper substrate 2200. For example, the width of the lower substrate 2100 in the second direction Y may be greater than the width of the upper substrate 2200 in the second direction Y. In an embodiment, the lower substrate 2100 may protrude toward a wavelength conversion member 100 as compared with the upper substrate 2200.

The display panel 2000 and the backlight unit 1000 may be connected (or coupled) with each other using a connecting member. For example, the backlight unit 1000 may be accommodated in a frame mold, and the display panel 2000 may be disposed on the frame mold or connected (coupled) with the frame mold. In another embodiment, the backlight unit 1000 and the display panel 2000 may be connected with each other using a bonding resin. In another embodiment, the backlight unit 1000 and the display panel 2000 may be connected with each other by bringing an upper surface of a light guide plate 200 of the backlight unit 1000 and a lower surface of the lower substrate 2100 of the display panel into direct contact with each other.

The backlight unit 1000 according to this embodiment includes the light guide plate 200, a light source unit 300 disposed adjacent to the light guide plate 200, and the wavelength conversion member 100 disposed between the light guide plate 200 and the light source unit 300.

The light guide plate 200 may guide the light provided from the light source unit 300 and transmit the guided light toward the display panel 2000 located over the backlight unit 1000. For example, the side surface of the light guide plate 200, adjacent to the light source unit 300, may form a light incoming surface, and the upper surface of the light guide plate 200 may form a light outgoing surface. The light incoming through the side face (the light incoming surface) of the light guide plate 200 may travel in the light guide plate 200 through total reflection, and at least a part of the light guided through the total reflection may leave through the upper surface (the light outgoing surface) of the light guide plate 200. In an embodiment, a scattering pattern or a concavo-convex pattern may be formed on the lower surface of the light guide plate 200 to change the path of the light guided in the light guide plate 200.

The material of the light guide plate 200 is not particularly limited as long as it is a material having high light transmittance and capable of guiding the light provided from the light source unit 300 without substantial light loss. For example, the light guide plate 200 may be made of a glass material or a plastic material such as polycarbonate, polystyrene, and/or polyethylene terephthalate.

The light source unit 300 may be disposed adjacent to the side surface (e.g., the light incoming surface) of the light guide plate 200. The light source unit 300 may be spaced apart from the light incoming surface of the light guide plate 200 by a set distance. In an example embodiment, the light source unit 300 may include a light source circuit substrate 310 and a light source 320 mounted on the light source circuit substrate 310.

The light source circuit substrate 310 may be configured to be connected to an external power source or the like, in order to provide a signal and power necessary for driving the light source 320. The light source circuit board 310 may have a plate shape extending (elongated) in an approximately first direction X.

The light source 320 may be disposed on the light source circuit board 310. A plurality of light sources 320 may be disposed on the light source circuit board 310 and the plurality of light sources 320 may be spaced apart from each other along the extension direction of the light source circuit board 310, for example, along the first direction X. In an embodiment, the light source 320 may be a light emitting diode (LED).

In an example embodiment, the light source 320 may be a light emitting diode that emits blue light. For example, the light source 320 may emit blue light having a single peak wavelength located within a wavelength range of about 430 nm to 470 nm. About 80% or more of the light emitted by the light source 320 may be within a wavelength range of 430 nm to 470 nm. In another embodiment, the light source 320 may be a light emitting diode that emits light in the ultraviolet wavelength band.

The wavelength conversion member 100 may be disposed between the light guide plate 200 and the light source unit 300, for example, between the light guide plate 200 and the light source 320. The wavelength conversion member 100 may extend along a direction in which the plurality of light sources are arranged to be spaced apart from each other, for example, along the first direction X. The wavelength conversion member 100 may be spaced apart from the light source unit 300 by a predetermined (or set) distance. Since the wavelength conversion member 100 and the light source unit 300 are spaced apart from each other, it is possible to minimize (or reduce) the damage of a first wavelength converter 110 and a second wavelength converter 120 in the wavelength conversion member 100 that may result due to the heat emitted from the light source unit 300.

The wavelength conversion member 100 may include a first wavelength converter 110 for converting the wavelength of transmitted light, a second wavelength converter 120 for converting the wavelength of transmitted light, a first glass 130 for providing a space for accommodating the first wavelength converter 110, and a second glass 140 for providing a space for accommodating the second wavelength converter 120.

Each of the first wavelength converter 110 and the second wavelength converter 120 may convert the wavelength of the transmitted light. For example, each of the first wavelength converter 110 and the second wavelength converter 120 may be a wavelength shifting member capable of shifting the peak wavelength of transmitted light. The first wavelength converter 110 may include a first base resin 110*a* and a first wavelength converting material 110*b* dispersed in the first base resin 110*a*, and may further include metal particles 110*c* dispersed in the first base resin 110*a*. The second wavelength converter 120 may include a second base resin 120*a* and a second wavelength converting material 120*b* dispersed in the second base resin 120*a*. The second wavelength converting material 120*b* may be different from the first wavelength converting material 110*b*.

The first base resin 110*a* and the second base resin 120*a* may occupy most of the volume of the first wavelength converter 110 and the second wavelength converter 120, respectively. Each of the first base resin 110*a* and the second base resin 120*a* may be made of a material having high light transmittance and capable of uniformly dispersing the wavelength converting material and/or the metal particles. The first base resin 110*a* and the second base resin 120*a* may be made of the same or different materials. For example, each of the first base resin 110*a* and the second base resin 120*a* may be a (meth)acrylate resin, an epoxy resin, a urethane resin, and/or a polyimide resin. Each of the first base resin 110*a* and the second base resin 120*a* may be a thermosetting resin or an ultraviolet curable resin.

The first wavelength converting material 110*b* and the second wavelength converting material 120*b* may each emit light having a specific peak wavelength. For example, each of the first wavelength converting material 110*b* and the second wavelength converting material 120*b* may be a material that converts incident light into light having a specific peak wavelength, and then emits the light. In an example embodiment, the first wavelength converting material 110b may emit red light, and the second wavelength converting material 120b may emit green light.

Examples of the first wavelength converting material 110b and the second wavelength converting material 120b may include a fluorescent material and a quantum dot material, but are not limited thereto. In the case of the quantum dot material, light having a specific peak wavelength can be emitted in the course of transferring electrons from the conduction band to the valence band. The quantum dot material may have a core-shell structure. The core may be a semiconductor nanocrystalline material. Examples of the core of the quantum dot material include Si-based nanocrystals, II-VI group-based compound nanocrystals, and III-V group-based compound nanocrystals, but the present invention is not limited thereto. As a non-limiting example, each of the first wavelength converting material 110b and the second wavelength converting material 120b may include a core made of any one of cadmium selenide (CdSe), cadmium telluride (CdTe), cadmium sulfide (CdS), and indium phosphide (InP), and an outer shell made of zinc sulfide (ZnS).

The average diameter of the particles of the first wavelength converting material 110b may be larger than the average diameter of the particles of the second wavelength converting material 120b. For example, the average diameter of all the wavelength converting materials in the first wavelength converter 110 (if two or more first wavelength converting materials are included) may be about 55 Å to 65 Å, and the average diameter of all the wavelength converting materials in the second wavelength converter 120 (if two or more second wavelength converting materials are included) may be about 40 Å to 50 Å. As a non-limiting example, the wavelength converting material in the first wavelength converter 110 may be composed of only the first wavelength converting material 110b that emits red light, and the wavelength converting material in the second wavelength converter 120 may be composed of only the second wavelength converting material 120b that emits green light.

In an example embodiment where the light source 320 emits blue light having a single peak wavelength located within a wavelength range of about 430 nm to 470 nm, the blue light emitted by the light source 320 may sequentially pass through the first wavelength converter 110 and the second wavelength converter 120. In this case, at least a part of the blue light emitted from the light source 320 may be converted into red light having a peak wavelength located within a wavelength range of about 610 nm to 650 nm by the first wavelength converter 110, and at least a part of the blue light emitted from the light source 320 may pass through the first wavelength converter 110 as it is (without being converted). In addition, at least a part of the light that passed through the first wavelength converter 110 may be further converted into green light having a peak wavelength located within a wavelength range of about 530 nm to 570 nm by the second wavelength converter 120, and at least a part of the light that passed through the first wavelength converter 110 may pass through the second wavelength converter 120 as it is (without being converted).

Since the light converted by the first wavelength converter 110 and the second wavelength converter 120 has a strong intensity peak wavelength in a narrow wavelength range, such light (after passing through the first wavelength converter 110 and the second wavelength converter 120) may have an intrinsic wavelength of a specific color and have excellent (or suitable) color purity. For example, the light emitted by the light source 320, after passing through the wavelength conversion member 100, may be a high-purity white light only having a peak of a red intrinsic wavelength, a peak of a green intrinsic wavelength, and a peak of a blue intrinsic wavelength.

In some embodiments, the first wavelength converter 110 may further include metal particles 110c dispersed in the first base resin 110a. The metal particles 110c in the first wavelength converter 110 can further increase the color conversion efficiency of the wavelength conversion member 100. The metal particles 110c may be metal particles capable of scattering light in a long wavelength band such as green light and/or red light, without substantially scattering light in a short wavelength band such as blue light. For example, the metal particles 110c may be aluminum oxide ($Al_2O_3$) particles and/or silicon oxide ($SiO_2$) particles. The average diameter of the metal particles 110c may be about 10 μm to 100 μm. Unlike, for example, titanium oxide ($TiO_2$) particles that scatter light in a short wavelength band, the metal particles 110c that do not substantially scatter light in a short wavelength band. When such metal particles are disposed (placed) in the first wavelength converter 110, they may cause the scattering of red light emitted by the first wavelength converting material 110b, while also ensuring that a sufficient amount of blue light can pass through the first wavelength converter 110, without wavelength conversion, and can then be converted into green light by the second wavelength converter 120. As a result, the color conversion efficiency of the wavelength conversion member 100 may be improved. In some embodiments, the second wavelength converter 120 may include only the second base resin 120a and the second wavelength converting material 120b, without substantially including the metal particles.

Each of the first wavelength converter 110 and the second wavelength converter 120 may have a thickness $t_{110}$ in the third direction Z, and the thickness $t_{110}$ of each of the first wavelength converter 110 and the second wavelength converter 120 may be greater than a width $W_{320}$ of the light-emitting surface of the light source 320 in the third direction Z. For example, the width $W_{320}$ of the light source 320 may be about 1.5 mm to 2.5 mm, and the thickness $t_{110}$ of each of the first wavelength converter 110 and the second wavelength converter 120 may be about 2.5 mm to 4 mm. Thus, it may be possible to prevent or reduce the leakage of the light emitted from the light source 320 before the light is color-converted by the first wavelength converter 110 and the second wavelength converter 120.

The first glass 130 and the second glass 140 may each be a container member capable of accommodating the first wavelength converter 110 and the second wavelength converter 120, respectively. Each of the first glass 130 and the second glass 140 may have a tubular shape having an inner hollow structure and extending in the first direction X, and each of the first wavelength converter 110 and the second wavelength converter 120 may be inserted into the hollow structure. FIG. 1 illustrates a case where the first wavelength converter 110 and the second wavelength converter 120 extend in the first direction X, and the wavelength conversion member 100 comprises one of each, but, in another embodiment, the plurality of first wavelength converters 110 and/or the plurality of second wavelength converters 120 may be arranged in the first direction X and spaced apart from each, for example, so as to be arranged at positions corresponding to the light sources 320.

Each of the first glass 130 and the second glass 140 may be made of a glass material having relatively high light transmittance. The first glass 130 and the second glass 140 may be made of the same material or different materials.

The first wavelength converter 110 may be accommodated by the first glass 130. On a sectional view taken along a direction perpendicular to the extending direction of the wavelength conversion member 100 (here, perpendicular to the first direction X), the first wavelength converter 110 may be completely surrounded by the first glass 130. With such arrangement, it may be possible to prevent or reduce the possibility of the first wavelength converter 110 from being contaminated and/or denatured by external moisture or impurities, and to improve the durability and lifetime of the wavelength conversion member 100.

The second wavelength converter 120 may be accommodated by the second glass 140. On a sectional view taken along a direction perpendicular to the extending direction of the wavelength conversion member 100 (here, perpendicular to the first direction X), the second wavelength converter 120 may be completely surrounded by the second glass 140. With such arrangement, it may be possible to prevent or reduce the possibility of the second wavelength converter 120 from being contaminated and/or denatured by external moisture or impurities, and to improve the durability and lifetime of the wavelength conversion member 100.

Hereinafter, a connection relationship between the first glass 130 and second glass 140 of the backlight unit 1000 and a connection relationship between the second glass 140 and light guide plate 200 of the backlight unit 1000 will be described in more detail with reference to FIGS. 4 and 5.

Figure 4:
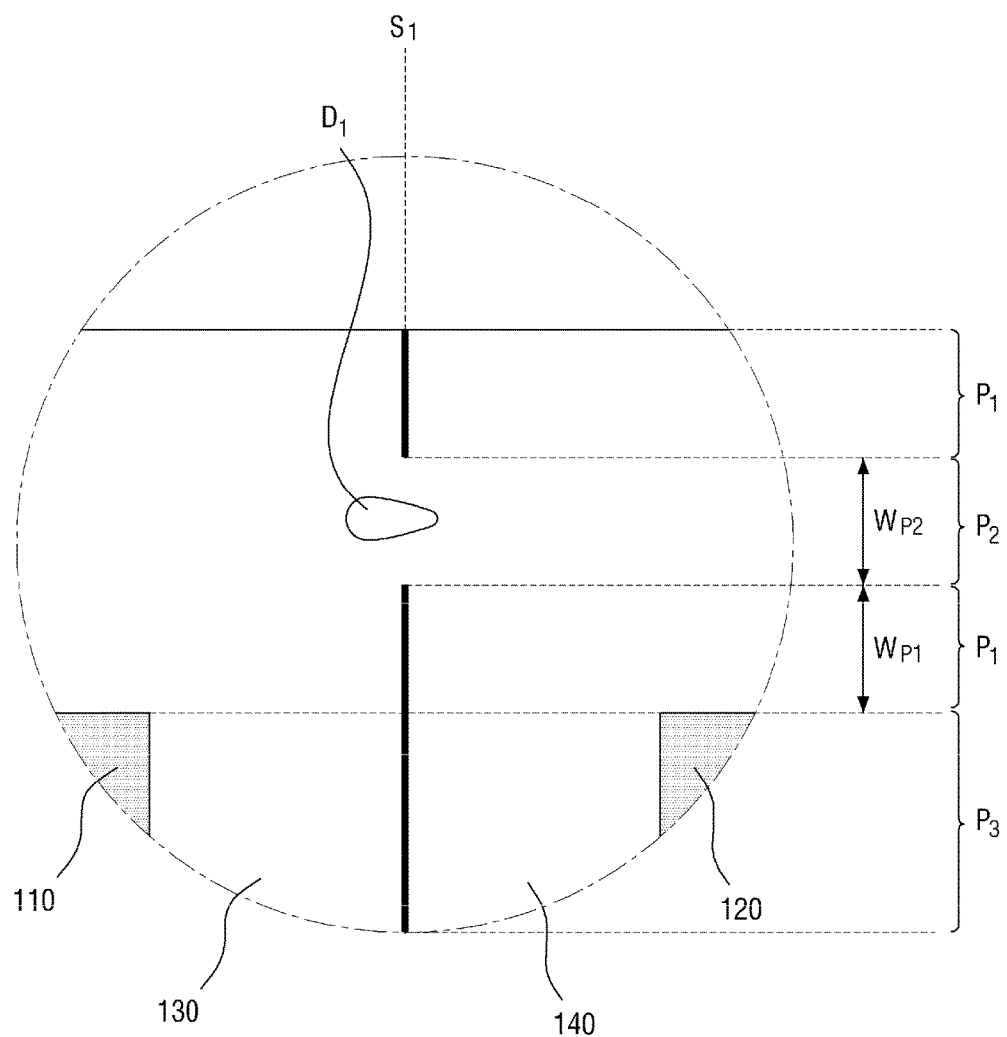
FIG. 4 is an enlarged sectional view of portion B of FIG. 3A.
Figure 5:
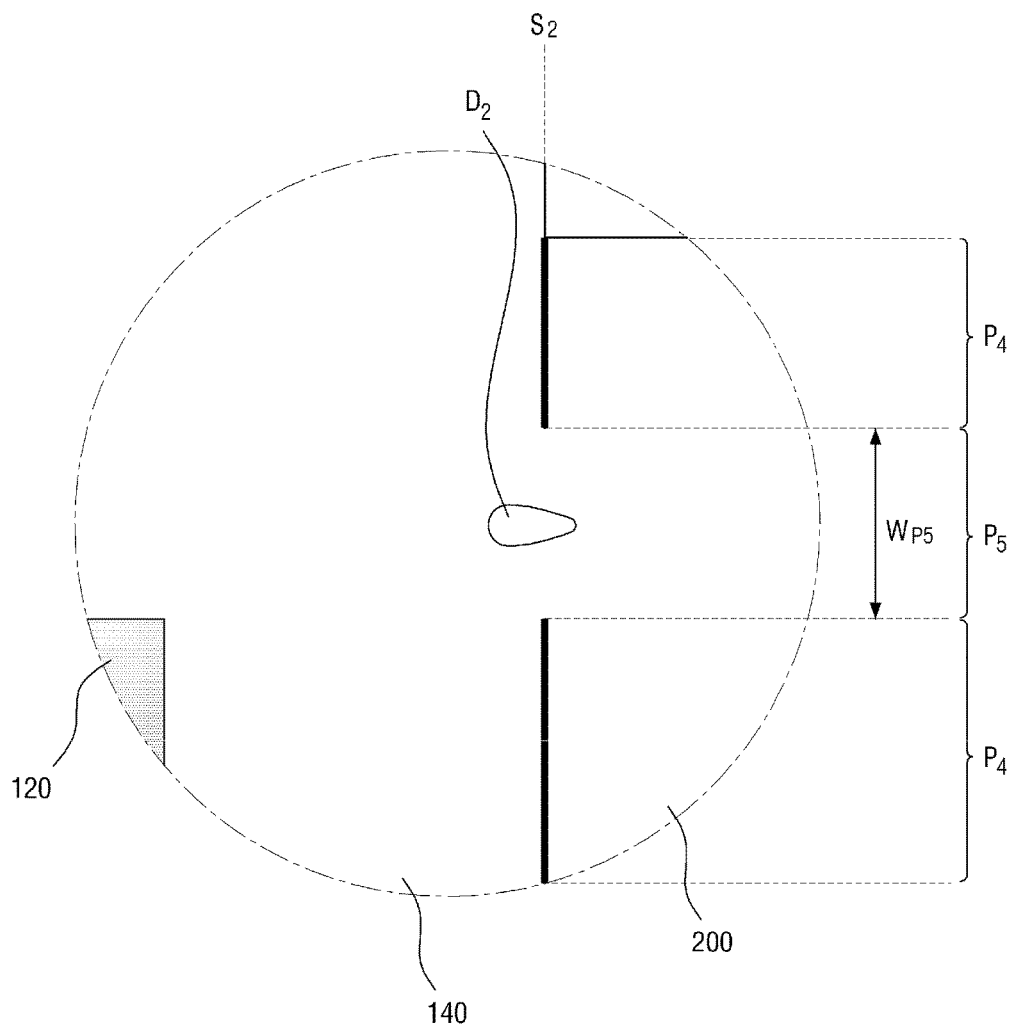
FIG. 5 is an enlarged sectional view of portion C of FIG. 3A.

FIG. 4 is an enlarged sectional view of portion B (a portion where the first glass 130 and the second glass 140 are connected or coupled) of FIG. 3A. FIG. 5 is an enlarged sectional view of portion C (a portion where the second glass 140 and the light guide plate 200 are connected or coupled) of FIG. 3A.

Referring to FIGS. 1 to 5, the first glass 130 and the second glass 140 may be connected or coupled to be at least partially in direct contact with each other. For example, the first glass 130 and the second glass 140 may be at least partially fusion-bonded to each other. In an embodiment, the first glass 130 and the second glass 140 may be integrated (e.g., coupled) by at least partial fusion-bonding. As used herein, "fusion-bonded" may refer to two materials being integrally connected or coupled to each other by, for example, welding.

The contact surface $S_1$ between the first glass 130 and the second glass 140 includes a first portion $P_1$ where there is a physical boundary between the first glass 130 and the second glass 140, a second portion $P_2$ where there is substantially no physical boundary between the first portion 130 and the second glass 140, and a third portion $P_3$ overlapping the first and second wavelength converters 110 and 120 in the second direction Y. In this specification, the term "substantially no physical boundary" between two components may refer to there being no naked-eye distinguishable boundary. The second portion $P_2$ may be a junction region between the first glass 130 and the second glass 140. For example, in the second portion $P_2$ of the contact surface $S_1$ between the first glass 130 and the second glass 140, the glass material of the first glass 130 and the glass material of the second glass 140 may be at least partially mixed, and thus the boundary between the first glass 130 and the second glass 140 may disappear. As a non-limiting example, at least a part of the glass material of the first glass 130 may penetrate into the second glass 140 to be mixed with the glass material of the second glass 140, and/or at least a part of the glass material of the second glass 140 may penetrate into the first glass 130 to be mixed with the glass material of the first glass 130.

The width $W_{P2}$ of the second portion $P_2$ of the contact surface $S_1$ between the first glass 130 and the second glass 140 may refer to the width of the junction region and may be 60 μm to 120 or 70 μm to 100 μm. In this specification, the term "junction" may refer to a region in which two components are in direct contact with each other. A seed-like structure $D_1$ may exist in the vicinity of the second portion $P_2$. The seed-like structure $D_1$ may be formed in the process of joining the first glass 130 and the second glass 140 together. In an example embodiment, the first glass 130 and the second glass 140 may be joined using a laser having a pulse width of about 10 femtoseconds to 50 femtoseconds. When the pulse width of the laser is set within the above range, even when the first glass 130 and/or the second glass 140 is irradiated with the laser to allow the laser to pass through the first glass 130 and/or the second glass 140, it is possible to prevent or reduce the possibility of the other parts of the glass, other than the intended junction region, from being deformed in shape, structure, physical properties, density of the glass material, and/or the like, thereby improving the reliability and durability of the backlight unit.

The seed-like structure $D_1$ may have an elongated shape having a major axis (e.g., abscissa axis illustrated in the drawing) and a minor axis (e.g., ordinate axis illustrated in the drawing). The seed-like structure $D_1$ may be asymmetric with respect to the minor axis. The seed-like structure $D_1$ may be in a state in which the minor axis is aligned in a direction parallel to the contact surface $S_1$, but the present invention is not limited thereto. The length of the minor axis of the seed-like structure $D_1$ may be about 10 μm to 20 μm.

In the example embodiment, the first portion $P_1$, the second portion $P_2$, and the third portion $P_3$ may be located at substantially the same level (e.g., substantially aligned along the third direction Z), where the first portion $P_1$ may be located between the second portion $P_2$ and the third portion $P_3$. In some embodiments, the second portion $P_2$ where there is substantially no physical boundary between the first glass 130 and the second glass 140 (i.e. the junction region) may be spaced apart from the first wavelength converter 110 and the second wavelength converter 120 in the third direction Z. For example, the shortest distance in the third direction Z ($W_m$) between the second portion $P_2$ and each of the first wavelength converter 110 and the second wavelength converter 120 may be about 50 μm or more. For example, the width of the first portion $P_1$ ($W_{P1}$) may be about 50 μm or more. When the second portion $P_2$ is spaced apart from the wavelength converters by 50 μm or more, it may be possible to prevent or reduce the possibility of the first wavelength converter 110 and/or the second wavelength converter 120 from being damaged by the high-temperature heat generated in the process of joining the first glass 130 and the second glass 140. In some embodiments, the first portion $P_1$ and the second portion $P_2$ may differ from each other in terms of light transmittance, refractive index, and/or density of glass material.

In an example embodiment where the first glass 130 and the second glass 140 have a shape extending in the first direction X, the junction region may be located at both a pair of long sides and a pair of short sides, may be located at only a pair of long sides, or may be located at only a pair of short sides. That is, the shape of the junction region may be an approximately "□" shape or an approximately "=" shape.

The wavelength conversion member 100 according to an embodiment includes a first glass 130 for accommodating/sealing the first wavelength converter 110 and a second glass

140 for accommodating/sealing the second wavelength converter 120, and the first glass 130 and the second glass 140 are formed as an integrated module, thereby converting the light provided from the light source 320 into high-purity white light. Further, the first wavelength converter 110, which may be a red wavelength conversion member, and the second wavelength converter 120, which may be a green wavelength conversion member, are spaced apart from each other, and the light emitted from the light source 320 sequentially passes through the first wavelength converter 110 and the second wavelength converter 120, thereby further improving color conversion efficiency. For example, when the red wavelength converting material and the green wavelength converting material are mixed in one base resin, color conversion efficiency can be improved, compared to when the green wavelength converter and the red wavelength converter are sequentially arranged.

Further, since the first glass 130 accommodating the first wavelength converter 110 and the second glass 140 accommodating the second wavelength converter 120 are arranged to be at least partially in direct contact with each other without physical boundary, no (or reduced) deformation occurs in the junction region between the first glass 130 and the second glass 140, even when the wavelength conversion member 100 is heated by the heat emitted from the light source 320, thereby improving durability and reliability.

In an embodiment, the wavelength conversion member 100 and the light guide plate 200 may be connected to be at least partly in direct contact with each other. For example, the second glass 140 of the wavelength conversion member 100 and the light-incoming surface of the light guide plate 200 may be at least partially fusion-bonded to each other. That is, the wavelength conversion member 100 and the light guide plate 200 may be integrated by at least partial fusion-bonding.

The contact surface $S_2$ between the second glass 140 and the light guide plate 200 may include a fourth portion $P_4$ where there is a physical boundary between the second glass 140 and the light guide plate 200 and a fifth portion $P_5$ where there is substantially no physical boundary between the second glass 140 and the light guide plate 200. For example, the fifth portion $P_5$ may be a junction region between the second glass 140 and the light guide plate 200.

The width $W_{P5}$ of the fifth portion $P_5$ (in the third direction Z) of the contact surface $S_2$ between the second glass 140 and the light guide plate 200 (i.e. the width of the junction region) may be 60 μm to 120 μm, or 70 μm to 100 μm. A seed-like structure $D_2$ may exist in the vicinity of the fifth portion $P_5$. The seed-like structure $D_2$ may be formed in the process of joining the second glass 140 and the light guide plate 200 together. In an example embodiment, the second glass 140 and the light guide plate 200 may be joined using a laser having a pulse width of about 10 femtoseconds to 50 femtoseconds. The seed-like structure $D_2$ may have an elongated shape having a major axis and a minor axis. The seed-like structure $D_2$ may be asymmetric with respect to the minor axis. The length of the minor axis of the seed-like structure $D_2$ may be about 10 μm to 20 μm.

In the example embodiment, the fourth portion $P_4$ and the fifth portion $P_5$ may be located at substantially the same level (e.g., substantially aligned along the third direction Z), and the fifth portion $P_5$ may not overlap the second wavelength converter 120 in the second direction Y. For example, the fifth portion $P_5$ where there is substantially no physical boundary between the second glass 140 and the light guide plate 200 (i.e. the junction region) may not overlap the second wavelength converter 120 in a sectional view (e.g., as illustrated in FIG. 5). Since the fifth portion $P_5$ and the second wavelength converter 120 do not overlap each other, it may be possible to prevent or reduce the possibility that the laser beam used in the process of joining the first glass 130 and the second glass 140 may pass through the second wavelength converter 120 and damage the second wavelength converter 120. In some embodiments, the fourth portion $P_4$ and the fifth portion $P_5$ may differ from each other in terms of light transmittance, refractive index, and/or density of glass material.

The backlight unit 1000 according to an embodiment may be configured such that the wavelength conversion member 100 accommodating the plurality of wavelength converters is integrated with the light guide plate 200 to form a module. Thus, even when an external impact is applied to the backlight unit 1000 or the display device including the backlight unit 1000, it may be possible to prevent or reduce the misalignment between the wavelength conversion member 100 and the light guide plate 200, and thus it may be possible to prevent or reduce the possibility of the light emitted from the light source 320 from being incident on the light guide plate 200 without first passing through the wavelength conversion member 100. Further, it may be possible to prevent or reduce the possibility of the light passing through the wavelength conversion member 100 and from being leaked without being incident on the light guide plate 200. Thus, it may be possible to increase the coupling efficiency between the wavelength conversion member 100 and the light guide plate 200. Consequently, desired (or suitable) color conversion efficiency may be exhibited. In addition, a defect in which color balance is collapsed (e.g., when an intrinsic wavelength of a specific color is relatively prominent) can be minimized or reduced.

In addition, since the wavelength conversion member 100 accommodating the plurality of wavelength converters and the light guide plate 200 are connected to be at least partially in direct contact with each other without physical boundary, deformation that may otherwise occur in the junction region between the wavelength conversion member 100 and the light guide plate 200 may be prevented or reduced, even when the wavelength conversion member 100 and the light guide plate 200 are heated by the heat emitted from the light source 320. Thus, the durability and reliability of the backlight unit 1000 may be improved.

Hereinafter, backlight units according to other embodiments of the present invention will be described. However, a description of the same or similar features or elements as those described in connection with the backlight unit 1000 according to the embodiment of FIG. 1 will not be provided, as descriptions of these elements should be apparent to those skilled in the art from the corresponding descriptions provided above and from the accompanying drawings.

Figure 6:
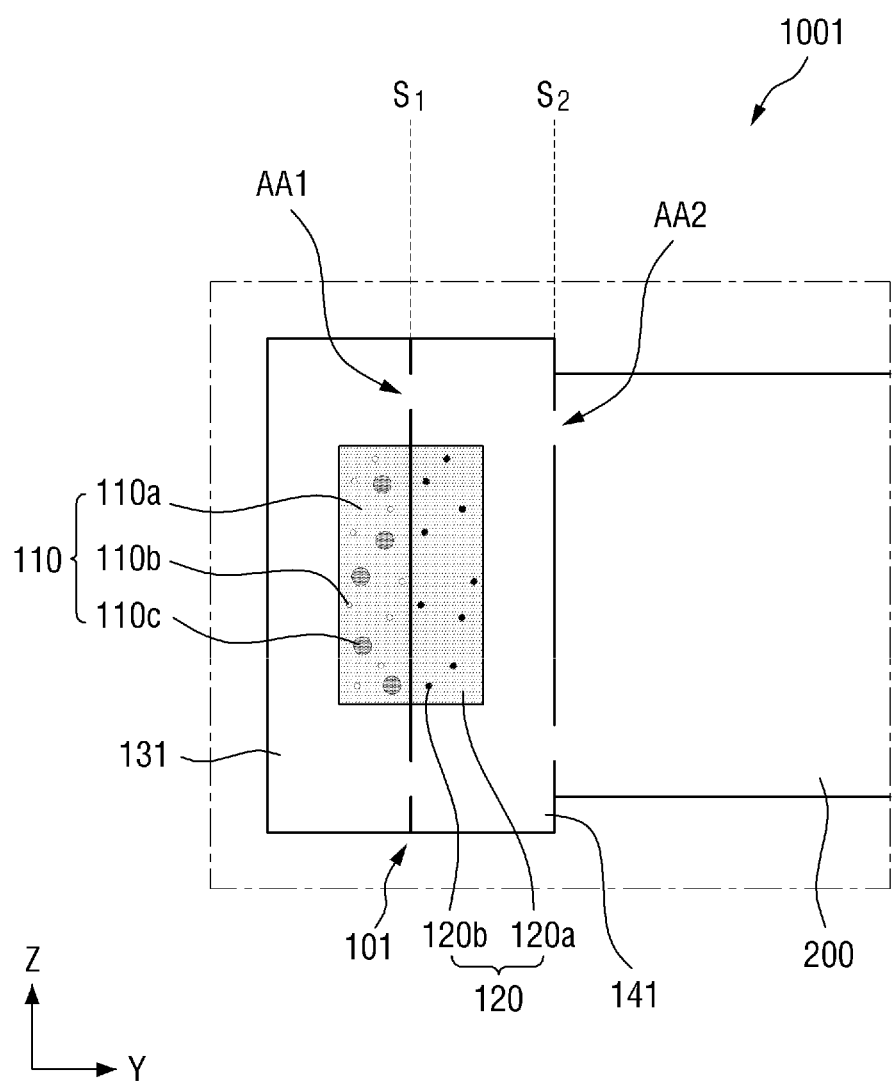
FIG. 6 is an enlarged sectional view of a backlight unit according to another embodiment of the present invention.

FIG. 6 is an enlarged sectional view of a backlight unit according to another embodiment of the present invention.

Referring to FIG. 6, a backlight unit 1001 includes a wavelength conversion member 101 including a first wavelength converter 110, a second wavelength converter 120, a first glass 131 providing a space for accommodating the first wavelength converter 110, and a second glass 141 providing a space for accommodating the second wavelength converter 120. The backlight unit 1001 according to this embodiment is different from the backlight unit 1000 according to the embodiment of FIG. 1 in that trench-shaped concave grooves extending in the first direction X are formed on any one side of the first glass 131 and the second glass 141, and the first wavelength converter 110 and the second wavelength converter 120 are inserted into the concave grooves.

Each of the first wavelength converter 110 and the second wavelength converter 120 may convert the wavelength of transmitted light. For example, the first wavelength converter 110 may be a red wavelength converter, and the second wavelength converter 120 may be a green wavelength converter. Since the first wavelength converter 110 and the second wavelength converter 120 have been described above with reference to, for example, FIG. 1, a detailed description thereof will not be provided again.

The first glass 131 and the second glass 141 may be container members that accommodate the first wavelength converter 110 and the second wavelength converter 120, respectively. In an example embodiment, one side (right side in the drawing) of the first glass 131, facing the second glass 141, may have a concave groove extending along the extension direction of the wavelength conversion member 1001 (e.g., along the first direction X), and the other side (left side in the drawing) of the second glass 141, facing the first glass 131, may have a concave groove extending along the first direction X.

The first wavelength converter 110 and the second wavelength converter 120 may be inserted into the concave grooves of the first glass 131 and the second glass 141, respectively. The first wavelength converter 110 and the second wavelength converter 120 may directly face each other, and may be at least partially in direct contact with each other. The first wavelength converter 110 and the second wavelength converter 120 may be accommodated by the first glass 131 and the second glass 141, respectively. On a sectional view taken along the extension direction of the wavelength conversion member 1001, that is, along a direction perpendicular to the first direction X, the first wavelength converter 110 and the second wavelength converter 120 may be completely surrounded by the first glass 131 and the second glass 141.

The first glass 131 and the second glass 141 may be at least partially in direct contact with each other. For example, the first glass 131 and the second glass 141 may be at least partially fusion-bonded to each other. The contact surface $S_1$ between the first glass 131 and the second glass 141 may include a portion where there is substantially no physical boundary therebetween (herein, referred to as a junction region AA1). Since the junction region AA1 between the first glass 131 and the second glass 141 is substantially similar to the junction region between the first glass 130 and the second glass 140 described above with reference to FIG. 4 and the like, a detailed description thereof will not be provided again.

In an embodiment, the wavelength conversion member 101 and the light guide plate 200 may be at least partially in direct contact with each other. For example, the second glass 141 of the wavelength conversion member 101 and the light incoming surface of the light guide plate 200 may be at least partially fusion-bonded to each other. The contact surface $S_2$ between the second glass 141 and the light guide plate 200 may include a portion where there is substantially no physical boundary therebetween (herein, referred to as a junction region AA2). Since the junction region AA2 between the second glass 141 and the light guide plate 200 is substantially similar to the junction region between the second glass 140 and the light guide plate 200 described above with reference to FIG. 5 and the like, a detailed description thereof will not be provided again.

Figure 7:
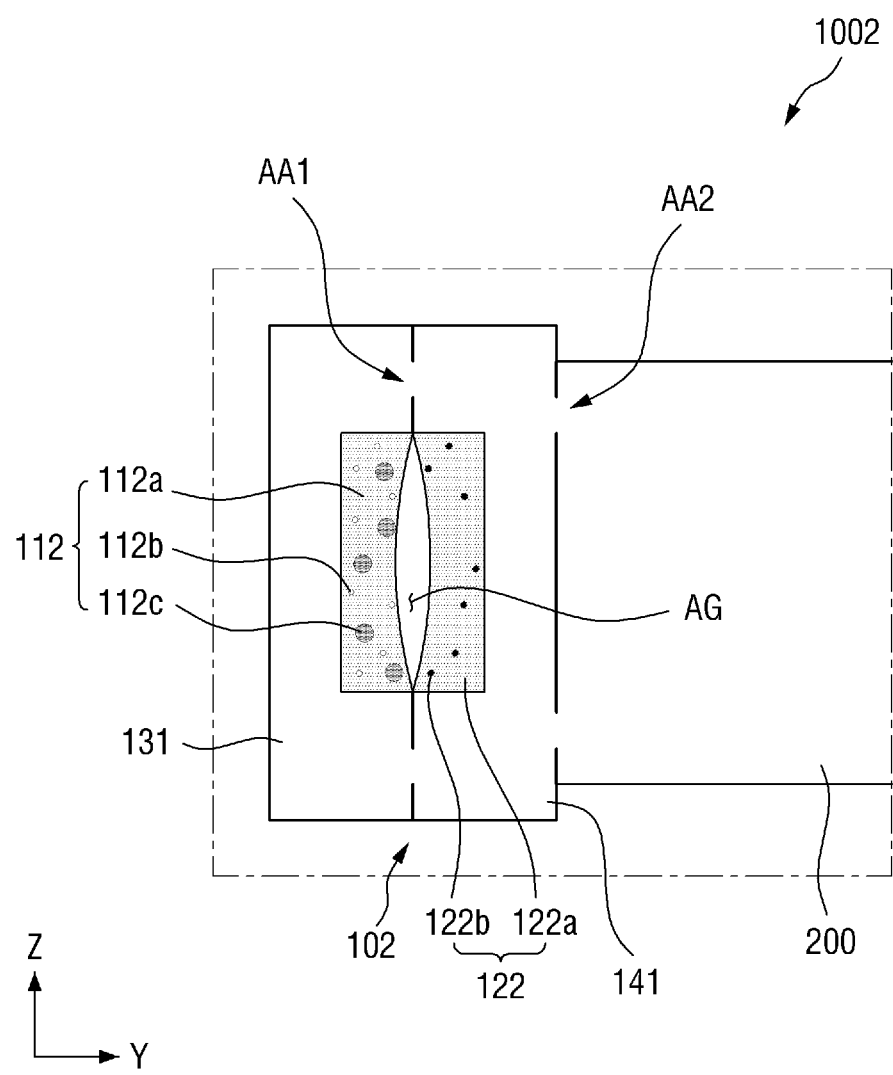
FIG. 7 is an enlarged sectional view of a backlight unit according to another embodiment of the present invention.

FIG. 7 is an enlarged sectional view of a backlight unit according to another embodiment of the present invention.

Referring to FIG. 7, a backlight unit 1002 according to this embodiment includes a wavelength conversion member 102 including a first wavelength converter 112 and a second wavelength converter 122. The backlight unit 1002 according to this embodiment is different from the backlight unit 1001 according to the embodiment of FIG. 6 in that there is a gap AG formed between the first wavelength converter 112 and the second wavelength converter 122.

In an example embodiment, the first wavelength converter 112 is inserted into the concave groove of the first glass 131, but the first wavelength converter 112 may not completely fill the concave groove of the first glass 131. That is, the volume occupied by the first wavelength converter 112 may be smaller than the volume of the space provided by the concave groove of the first glass 131. Further, the second wavelength converter 122 is inserted into the concave groove of the second glass 141, but the first wavelength converter 112 may not completely fill the concave groove of the second glass 141.

In an embodiment, nitrogen gas ($N_2$) or an air layer may be interposed in the gap AG. The gap AG may form a low refractive index region having a lower refractive index than those of the first wavelength conversion unit 112, the second wavelength conversion unit 122, the first glass 131, and the second glass 141. The red light and blue light that pass through the first wavelength converter 112 may then pass through the gap AG, a low refractive index region, before passing through the second wavelength converter 122, thereby maximizing photo-excitation efficiency. Thus, the color conversion efficiency can be further improved by forming the gap AG between the first wavelength converter 112 and the second wavelength converter 122. Furthermore, by using the shape of the exposed surface (the surface facing the gap AG) of the first wavelength converter 112 and the shape of the exposed surface (the surface facing the gap AG) of the second wavelength converter 122, a light outgoing direction may be controlled.

Figure 8:
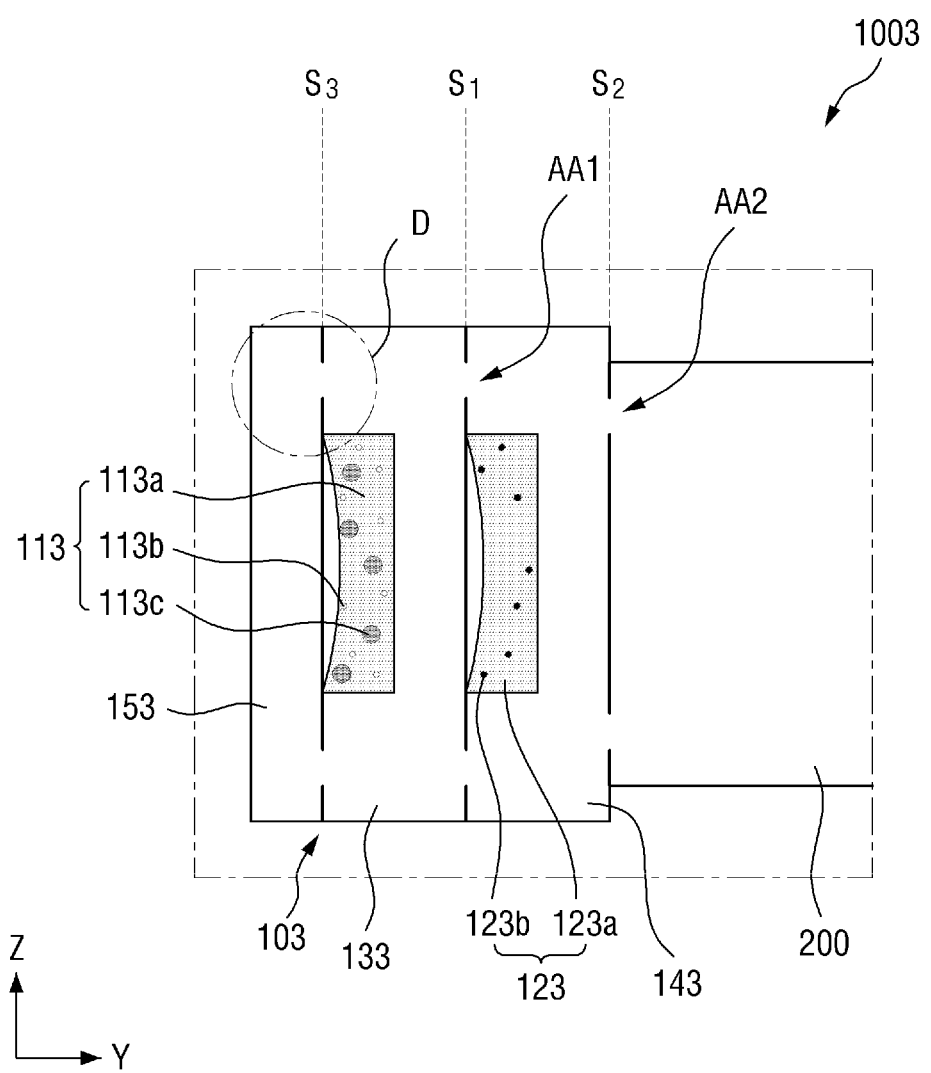
FIG. 8 is an enlarged sectional view of a backlight unit according to another embodiment of the present invention.
Figure 9:
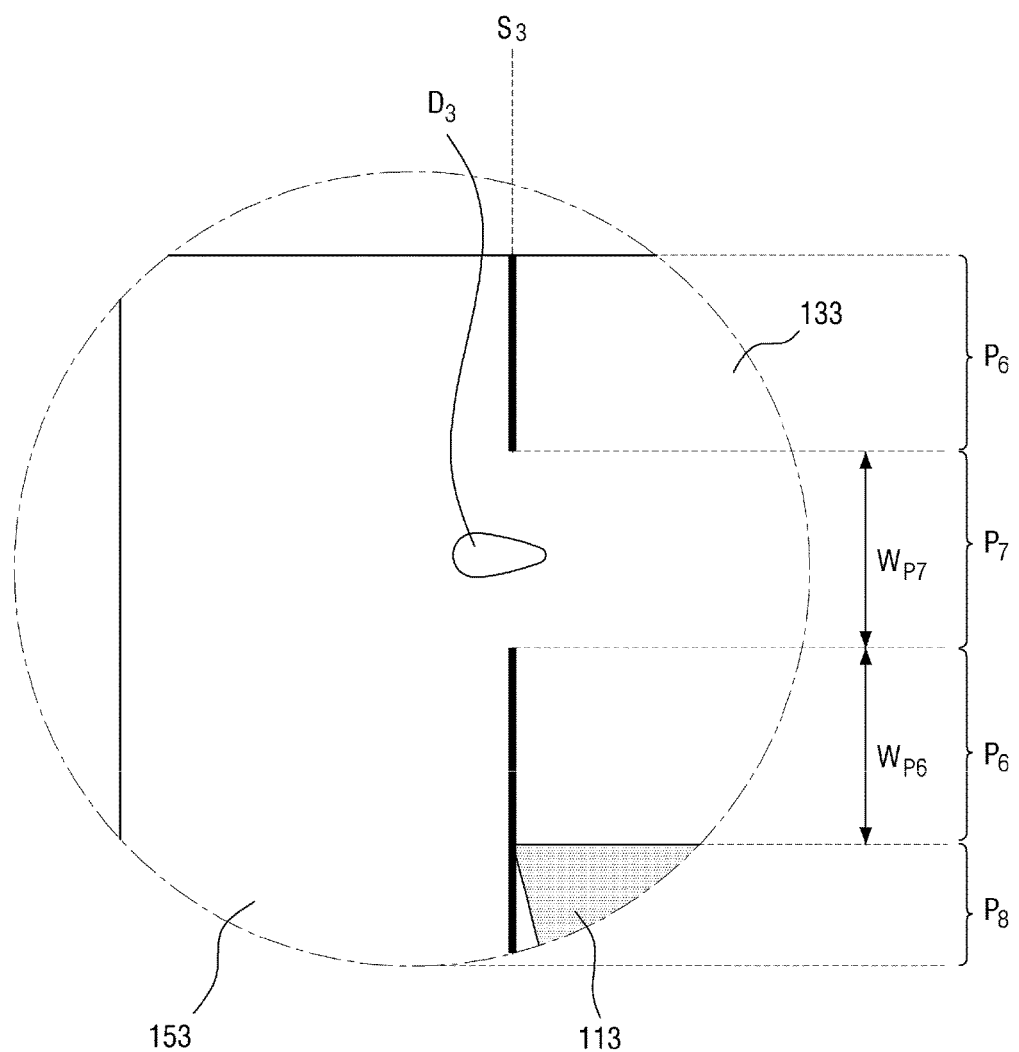
FIG. 9 is an enlarged sectional view of portion D of FIG. 8.

FIG. 8 is an enlarged sectional view of a backlight unit according to another embodiment of the present invention. FIG. 9 is an enlarged sectional view of portion D of FIG. 8.

Referring to FIGS. 8 and 9, a backlight unit 1003 according to this embodiment includes a wavelength conversion member 103 including a first wavelength converter 113, a second wavelength converter 123, a first glass 133 providing a space for accommodating the first wavelength converter 113, and a second glass 143 providing a space for accommodating the second wavelength converter 123. The backlight unit 1003 according to this embodiment is different from the backlight unit 1000 according to the embodiment of FIG. 1 and the like in that it further includes a third glass 153 sealing the first wavelength converter 113.

Each of the first wavelength converter 113 and the second wavelength converter 123 may convert the wavelength of transmitted light. For example, the first wavelength converter 113 may be a red wavelength converter, and the second wavelength converter 123 may be a green wavelength converter. Since the first wavelength converter 113 and the second wavelength converter 123 are substantially similar to the first wavelength converter 110 and the second wavelength converter 120, respectively, that have been described with reference to FIG. 1 and the like, a detailed description thereof will not be provided again.

The first glass 133 and the second glass 143 may be container members that accommodate the first wavelength converter 113 and the second wavelength converter 123, respectively, and the third glass 153 may be a cover member sealing the first wavelength converter 113. In an example embodiment, one side (right side in the drawing) of the third glass 153, facing the first glass 133, may be substantially flat. Further, the side of the first glass 133 facing the third glass 153 (left side in the drawing) may have a concave groove, and the side of the second glass 143 facing the first glass 133 (left side in the drawing) may have a concave groove. The first wavelength converter 113 may be inserted into the concave groove of the first glass 133, and may be completely surrounded by the first glass 133 and the third glass 153. The second wavelength converter 123 may be inserted into the concave groove of the second glass 143, and may completely surrounded by the first glass 133 and the second glass 143.

The first glass 133 and the third glass 153 may be at least partially in direct contact with each other. For example, the first glass 133 and the third glass 153 may be at least partially fusion-bonded to each other. The contact surface $S_3$ between the first glass 133 and the third glass 153 includes a sixth portion $P_6$ where there is a physical boundary between the first glass 133 and the third glass 153, a seventh portion $P_7$ where there is substantially no physical boundary between the first glass 133 and the third glass 153, and an eighth portion $P_8$ overlapping the first wavelength converter 113 in the second direction Y.

The width $W_{P7}$ of the seventh portion $P_7$ of the contact surface $S_3$ between the first glass 133 and the third glass 153 (herein, the seventh portion $P_7$ may be referred to as the junction region) may be 60 µm to 120 µm, or 70 µm to 100 µm. A seed-like structure $D_3$ may exist in the vicinity of the seventh portion $P_7$. The seed-like structure $D_3$ may be formed in the process of joining the first glass 133 and the third glass 153 together. In an example embodiment, the first glass 133 and the third glass 153 may be joined using a laser having a pulse width of about 10 femtoseconds to 50 femtoseconds. The seed-like structure $D_3$ may have an elongated shape having a major axis and a minor axis. The seed-like structure $D_3$ may be asymmetric with respect to the minor axis. The length of the minor axis of the seed-like structure $D_3$ may be about 10 µm to 20 µm.

In the example embodiment, the sixth portion $P_6$, the seventh portion $P_7$, and the eighth portion $P_8$ may be located at substantially the same level (e.g., substantially aligned along the third direction Z), and the sixth portion $P_6$ may be located between the seventh portion $P_7$ and the eighth portion $P_8$. For example, the seventh portion $P_7$ between the first glass 133 and the third glass 153 (i.e. the junction region) may be spaced apart from the first wavelength converter 113 in the third direction Z. The shortest distance $W_{P6}$ (in the third direction Z) between the seventh portion $P_7$ and the first wavelength converter 113 may be about 50 µm or more.

Since the junction region AA1 between the first glass 133 and the second glass 143 and the junction region AA2 between the second glass 143 and the light guide plate 200 have been described above with reference to FIGS. 4 and 5, a detailed description thereof will not be provided again.

FIG. 8 illustrates a case where a gap is formed between the first wavelength converter 113 and the third glass 153, and a gap is formed between the second wavelength converter 123 and the first glass 133. However, the first wavelength converter 113 may completely fill a space between the first glass 133 and the third glass 153 (e.g., there may be no gap between the the first wavelength converter 113 and the third glass 153), and the second wavelength converter 123 may completely fill a space between the first glass 133 and the second glass 143 (e.g., there may be no gap between the second wavelength converter 123 and the first glass 133).

Figure 10:
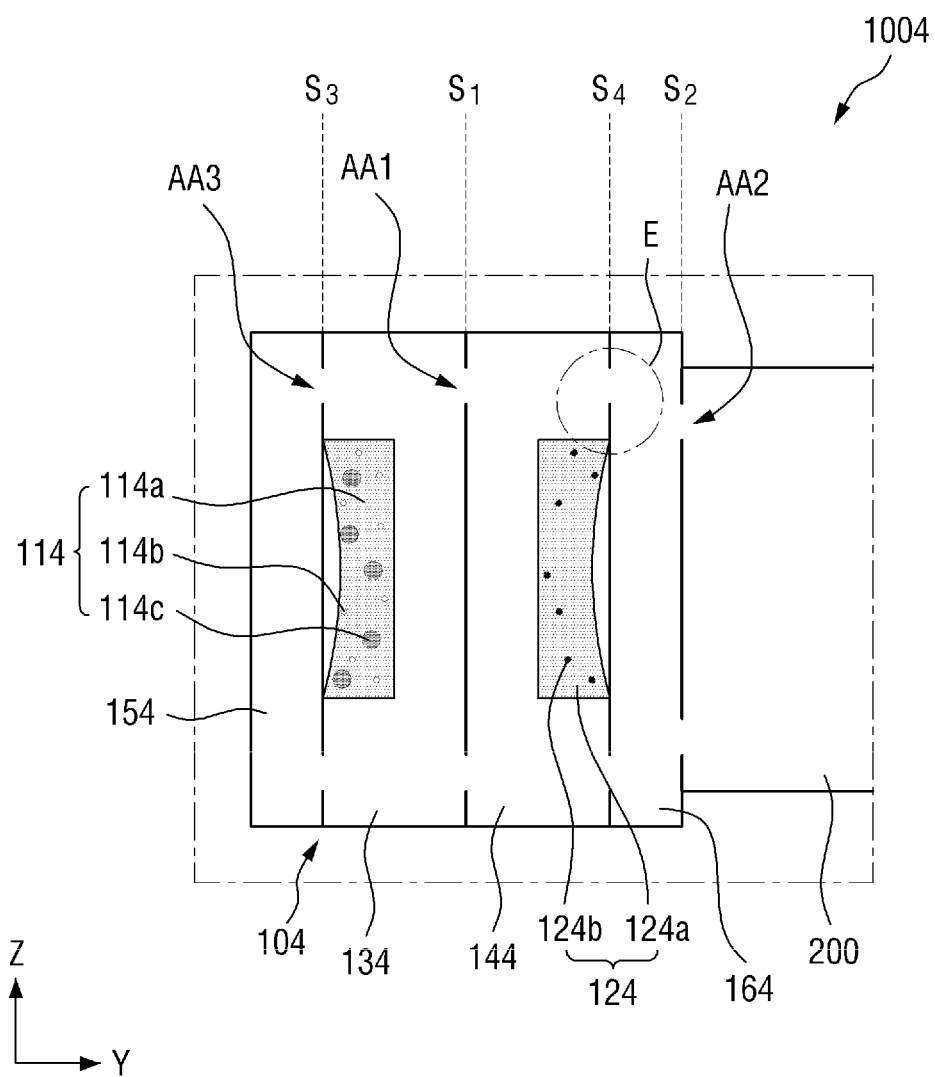
FIG. 10 is an enlarged sectional view of a backlight unit according to another embodiment of the present invention.
Figure 11:
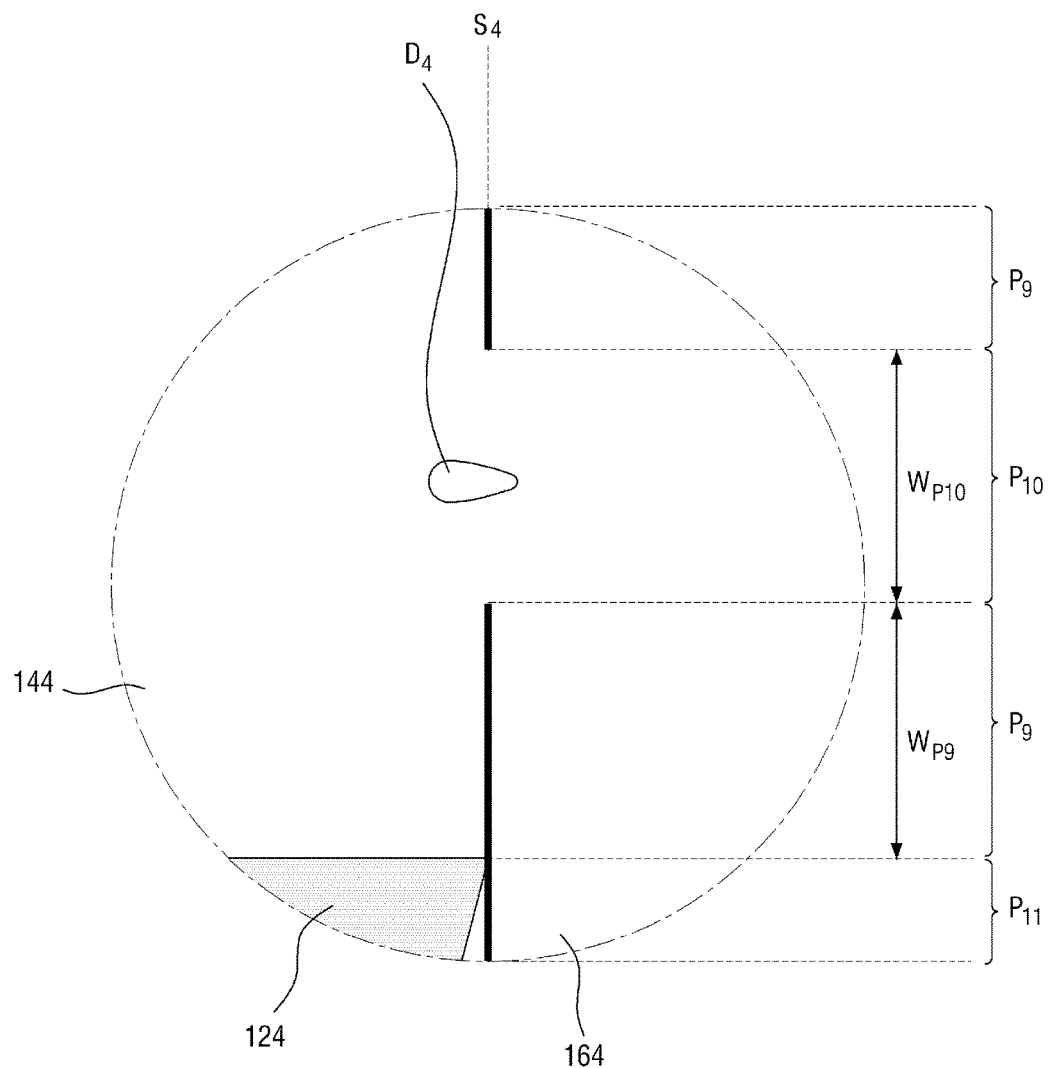
FIG. 11 is an enlarged sectional view of portion E of FIG. 10.

FIG. 10 is an enlarged sectional view of a backlight unit according to another embodiment of the present invention. FIG. 11 is an enlarged sectional view of portion E of FIG. 10.

Referring to FIGS. 10 and 11, a backlight unit 1004 according to this embodiment includes a wavelength conversion member 104 including a first wavelength converter 114, a second wavelength converter 124, a first glass 134 providing a space for accommodating the first wavelength converter 114, and a second glass 144 providing a space for accommodating the second wavelength converter 124. The backlight unit 1004 according to this embodiment is different from the backlight unit 1000 according to the embodiment of FIG. 1 and the like in that it further include a third glass 154 sealing the first wavelength converter 114 and a fourth glass 164 sealing the second wavelength converter 124.

Each of the first wavelength converter 114 and the second wavelength converter 124 may convert the wavelength of transmitted light. For example, the first wavelength converter 114 may be a red wavelength converter, and the second wavelength converter 124 may be a green wavelength converter. Since the first wavelength converter 114 and the second wavelength converter 124 are substantially similar to the first wavelength converter 110 and the second wavelength converter 120, respectively, that have been described above with reference to FIG. 1 and the like, a detailed description thereof will not be provided again.

The first glass 134 and the second glass 144 may be container members that accommodate the first wavelength converter 114 and the second wavelength converter 124, respectively, and the third glass 154 and the fourth glass 164 may be cover members sealing the first wavelength converter 114 and the second wavelength converter 124, respectively. In an example embodiment, one side of the third glass 154 facing the first glass 134 (right side in the drawing), may be substantially flat. Further, the side of the first glass 134 facing the third glass 154 (left side in the drawing), may have a concave groove, and the other side of the first glass 134, facing the second glass 144 (right side in the drawing), may be substantially flat. Further, the side of the second glass 144 facing the fourth glass 164 (right side in the drawing), may have a concave groove, and the other side of the fourth glass 164, facing the second glass 144 (left side in the drawing), may be substantially flat. The first wavelength converter 114 may be inserted into the concave groove of the first glass 134, and may be completely surrounded by the first glass 134 and the third glass 154. The second wavelength converter 124 may be inserted into the concave groove of the second glass 144, and may be completely surrounded by the second glass 144 and the fourth glass 164. In this embodiment, the light guide plate 200 may be at least partially in direct contact with the fourth glass 164, instead of the second glass 144.

The second glass 144 and the fourth glass 164 may be at least partially in direct contact with each other. For example, the second glass 144 and the fourth glass 164 may be at least partially fusion-bonded to each other. The contact surface $S_4$ between the second glass 144 and the fourth glass 164 may include a ninth portion $P_9$ where there is a physical boundary between the second glass 144 and the fourth glass 164, a tenth portion $P_{10}$ where there is substantially no physical boundary between the second glass 144 and the fourth glass 164, and an eleventh portion $P_{11}$ overlapping the second wavelength converter 124 in the second direction Y.

The width $W_{P10}$ of the tenth portion $P_{10}$ of the contact surface $S_4$ between the second glass 144 and the fourth glass 164 (herein, the tenth portion $P_{10}$ may be referred to as the junction region) may be 60 µm to 120 µm, or 70 µm to 100 µm. A seed-like structure $D_4$ may exist in the vicinity of the tenth portion $P_{10}$. The seed-like structure $D_4$ may be formed in the process of joining the second glass 144 and the fourth glass 164 together. In an example embodiment, the second glass 144 and the fourth glass 164 may be joined using a laser having a pulse width of about 10 femtoseconds to 50 femtoseconds. The seed-like structure $D_4$ may have an elongated shape having a major axis and a minor axis. The seed-like structure $D_4$ may be asymmetric with respect to the minor axis. The length of the minor axis of the seed-like structure $D_4$ may be about 10 µm to 20 µm.

In the example embodiment, the ninth portion $P_9$, the tenth portion $P_{10}$, and the eleventh portion $P_{11}$ may be located at substantially the same level (e.g., substantially aligned along the third direction Z), and the ninth portion $P_9$ may be located between the tenth portion $P_{10}$ and the eleventh portion $P_{11}$. In other words, the tenth portion $P_{10}$ between the second glass 144 and the fourth glass 164 (the junction region) may be spaced apart from the second wavelength converter 124 in the third direction Z. The shortest distance $W_{P9}$ (in the third direction Z) between the tenth portion $P_{10}$ and the second wavelength converter 124 may be about 50 µm or more.

Since the junction region AA1 between the first glass 134 and the second glass 144, the junction region AA2 between the fourth glass 164 and the light guide plate 200, and the junction region AA3 between the first glass 134 and the third glass 154 are substantially similar to the corresponding junction regions described above (e.g., with reference to FIGS. 4, 5, and 8), a detailed description thereof will not be provided again.

While FIG. 10 illustrates a case where a gap is formed between the first wavelength converter 114 and the third glass 154 and a gap is formed between the second wavelength converter 124 and the fourth glass 164, embodiments of the present disclosure are not limited thereto. For example, the first wavelength converter 114 may completely fill a space between the first glass 134 and the third glass 154 (e.g., there may be no gap between the first wavelength converter 114 and the third glass 154), and the second wavelength converter 124 may completely fill a space between the second glass 144 and the fourth glass 164 (e.g., there may be no gap between the second wavelength converter 124 and the fourth glass 164).

Figure 12:
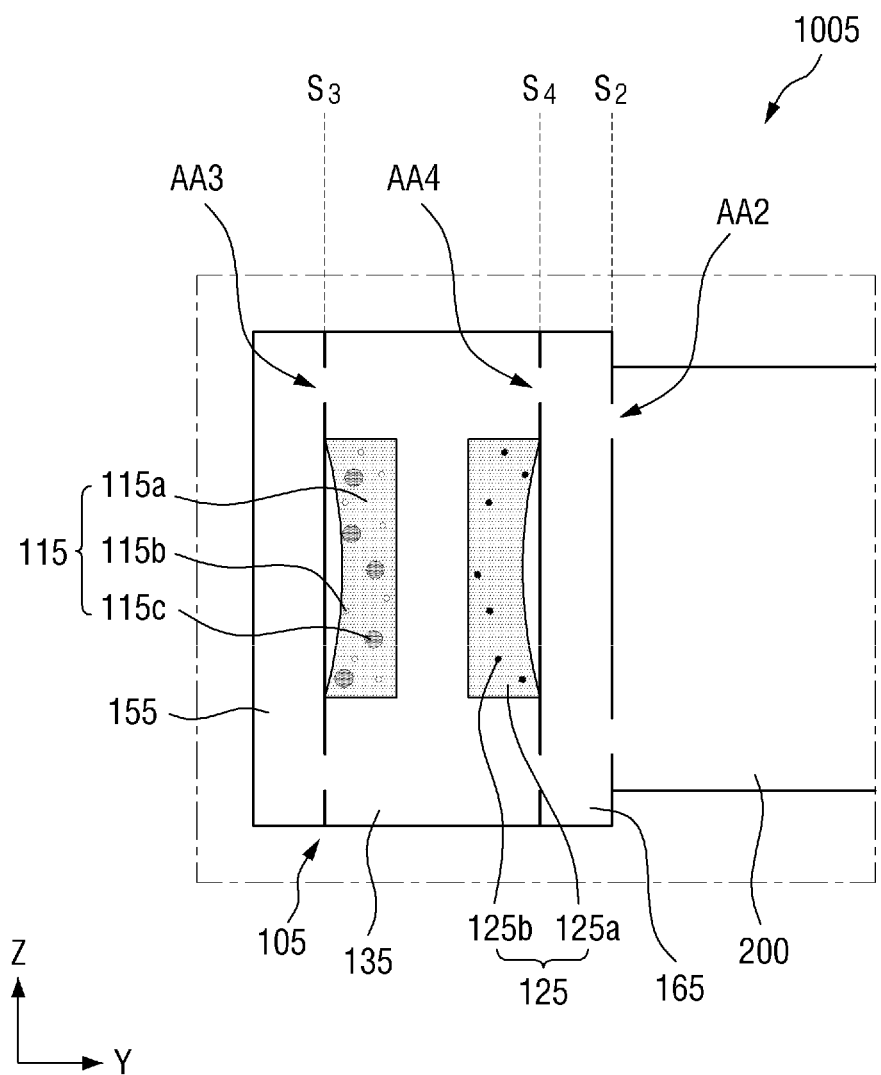
FIG. 12 is an enlarged sectional view of a backlight unit according to another embodiment of the present invention.

FIG. 12 is an enlarged sectional view of a backlight unit according to another embodiment of the present invention.

Referring to FIG. 12, a backlight unit 1005 according to this embodiment is different from the backlight unit 1004 according to the embodiment of FIG. 10 and the like in that a first wavelength converter 115 and a second wavelength converter 125 of a wavelength conversion member 105 are both inserted in one first glass 135.

The first glass 135 may be a container member that accommodates the first wavelength converter 115 and the second wavelength converter 125, and the third glass 155 and the fourth glass 165 may be cover members sealing the first wavelength converter 115 and the second wavelength converter 125. The first glass 135 may be integrally formed. For example, the light transmittance, refractive index and/or density of a glass material in the first glass 135 may be uniform.

In an example embodiment, the side of the third glass 155 facing the first glass 135 (right side in the drawing), may be substantially flat. Further, the side of the first glass 135 facing the third glass 155 (left side in the drawing), and the side of the first glass 135 facing the fourth glass 165 (right side in the drawing), may have concave grooves, respectively. Further, the side of the fourth glass 165 facing the first glass 135 (left side in the drawing), may be substantially flat. The first wavelength converter 115 may be inserted into the concave groove of the side of the first glass 135 facing the third glass 155, and the second wavelength converter 125 may be inserted into the concave groove of the side of the first glass 135 facing the fourth glass 165. The first wavelength converter 115 may be surrounded by the first glass 135 and the third glass 155 and the second wavelength converter 125 may be surrounded by the first glass 135 and the fourth glass 165.

Since the junction region AA2 between the fourth glass 165 and the light guide plate 200, the junction region AA3 between the first glass 135 and the third glass 155, and the junction region AA4 between the first glass 135 and the fourth glass 165 are substantially similar to the corresponding junction regions that have been described above (e.g., with reference to FIGS. 5, 8, and 10), a detailed description thereof will not be provided again.

Figure 13:
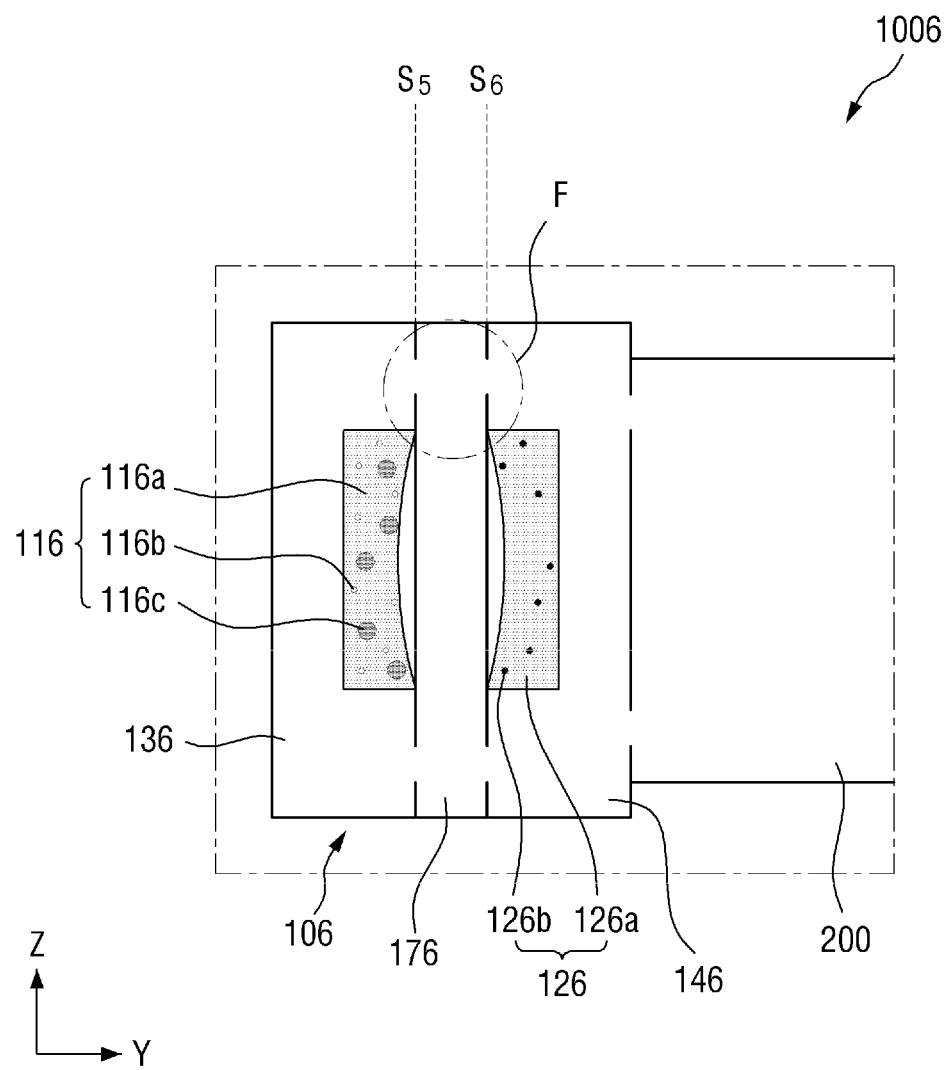
FIG. 13 is an enlarged sectional view of a backlight unit according to another embodiment of the present invention.
Figure 14:
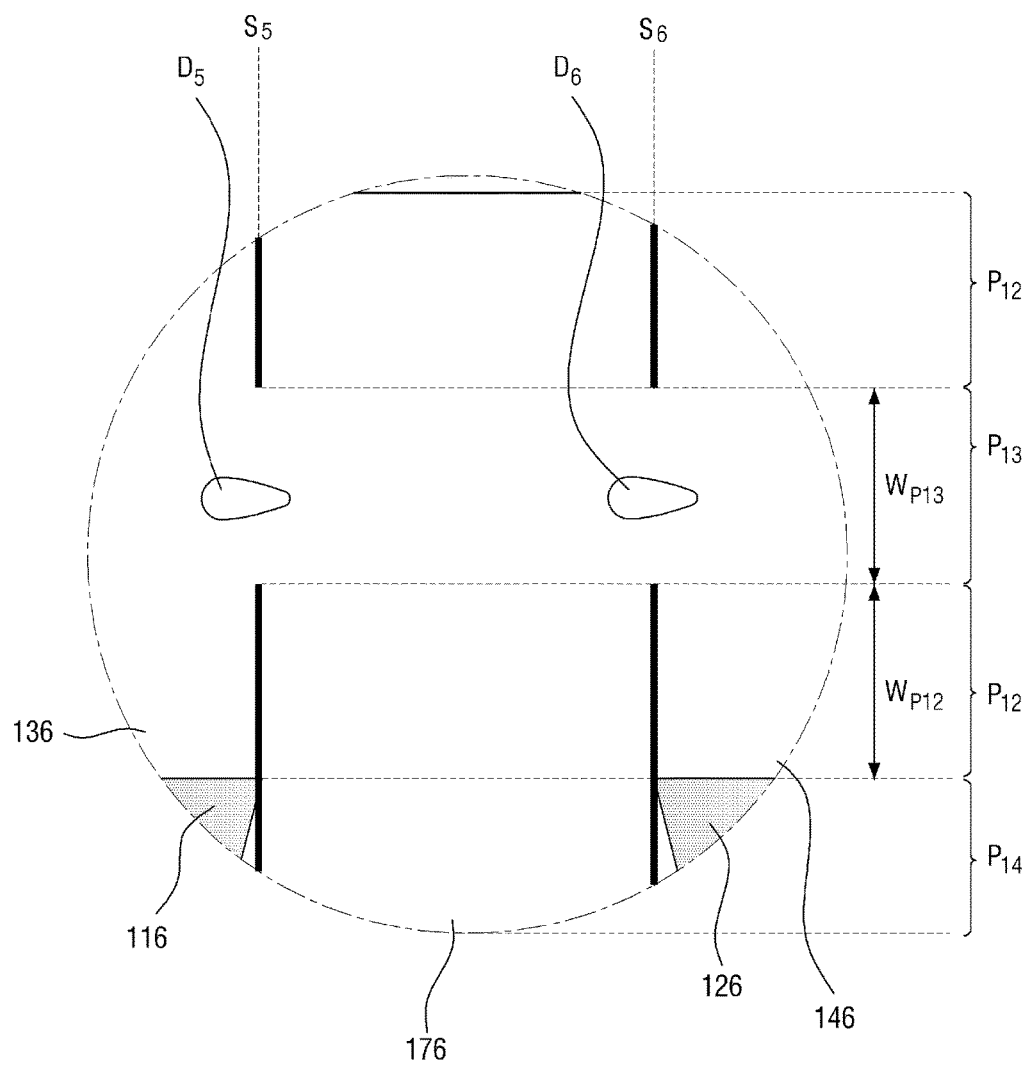
FIG. 14 is an enlarged sectional view of portion F of FIG. 13.

FIG. 13 is an enlarged sectional view of a backlight unit according to another embodiment of the present invention. FIG. 14 is an enlarged sectional view of portion F of FIG. 13.

Referring to FIGS. 13 and 14, a backlight unit 1006 according to this embodiment includes a wavelength conversion member 106 including a first wavelength converter 116, a second wavelength converter 126, a first glass 136 providing a space for accommodating the first wavelength converter 116, and a second glass 146 providing a space for accommodating the second wavelength converter 126. The backlight unit 1006 according to this embodiment is different from the backlight unit 1001 according to the embodiment of FIG. 6 and the like in that it further includes a fifth glass 176 interposed (positioned) between the first wavelength converter 116 and the second wavelength converter 126.

The first glass 136 and the second glass 146 may be container members that accommodate the first wavelength converter 116 and the second wavelength converter 126, respectively, and the fifth glass 176 may be a spacer member that spaces the first wavelength converter 116 and the second wavelength converter 126 from each other by a predetermined (or set) distance. In an example embodiment, the side of the first glass 136 facing the fifth glass 176 (right side in the drawing), may have a concave groove extending along the extension direction of the wavelength conversion member 106 (here, along the first direction X), and the side of the second glass 146 facing the fifth glass 176 (left side in the drawing), may have a concave groove extending along the first direction X. Further, both the side of the fifth glass 176 facing the first glass 136 (left side in the drawing) and the side of the fifth glass 176 facing the second glass 146 (right side in the drawing), may be substantially flat.

The first wavelength converter 116 and the second wavelength converter 126 may be inserted into the respective concave grooves. The first wavelength converter 116 may be surrounded by the first glass 136 and the fifth glass 176, and the second wavelength converter 126 may be surrounded by the second glass 146 and the fifth glass 176.

In an example embodiment, the first glass 136 and the fifth glass 176 may be at least partially in direct contact with each other, and the second glass 146 and the fifth glass 176 may be at least partially in direct contact with each other. For example, the first glass 136 and the fifth glass 176 may be at least partially fusion-bonded to each other, and the second glass 146 and the fifth glass 176 may be at least partially fusion-bonded to each other.

In an example embodiment, the contact surface $S_5$ between the first glass 136 and the fifth glass 176 and the contact surface $S_6$ between the second glass 146 and the fifth glass 176 may each include, in the second direction Y, a twelfth portion $P_{12}$ where there is a physical boundary between the respective adjacent glasses, a thirteenth portion $P_{13}$ where there is substantially no physical boundary between the respective adjacent glasses, and a fourteenth portion $P_{14}$ overlapping the wavelength converters 116 and 126.

The width $W_{P13}$ of the thirteenth portion $P_{13}$ (herein, the thirteenth portion $P_{13}$ may be referred to as the junction region) may be 60 μm to 120 μm, or 70 μm to 100 μm. Seed-like structures $D_5$ and $D_6$ may exist in the vicinity of the thirteenth portion $P_{13}$ of the contact surface $S_5$ between the first glass 136 and the fifth glass 176 and in the vicinity of the thirteenth portion $P_{13}$ of the contact surface $S_6$ between the second glass 146 and the fifth glass 176, respectively. The seed-like structures $D_5$ and $D_6$ may be formed in the process of joining the respective adjacent glasses together. In an example embodiment, the first glass 136 and the fifth glass 176, and the second glass 146 and the fifth glass 176 may be joined using a laser having a pulse width of about 10 femtoseconds to 50 femtoseconds, respectively. Each of the seed-like structures $D_5$ and $D_6$ may have an elongated shape having a major axis and a minor axis. Each of the seed-like structures $D_5$ and $D_6$ may be asymmetric with respect to the minor axis. The length of the minor axis of each of the seed-like structures $D_5$ and $D_6$ may be about 10 μm to 20 μm.

As described above, the wavelength conversion member according to an embodiment of the present invention can convert the light provided from a light source into high-purity white light.

The backlight unit according to an embodiment of the present invention can provide high-purity white light using the wavelength conversion member, can minimize or reduce the light loss between a wavelength conversion member and a light guide plate by accurately maintaining the alignment state between the wavelength conversion member and the light guide plate, even when an external impact is applied, and can maximize or improve color conversion efficiency.

The effects of the present invention are not limited by the foregoing, and other various effects are envisioned herein.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the present invention has been particularly illustrated and described with reference to example embodiments thereof, it will be understood by those of ordinary skill in the art that various changes in form and detail may be made therein without departing from the spirit and scope of the present invention as defined by the following claims and equivalents thereof. Thus, the example embodiments should be considered in a descriptive sense only and not for purposes of limitation.

What is claimed is:

1. A wavelength conversion member, comprising:
a first wavelength converter extending in a first direction and comprising a first wavelength converting material;
a second wavelength converter extending in the first direction and comprising a second wavelength converting material different from the first wavelength converting material;
a first container member extending in the first direction and providing a space for accommodating the first wavelength converter; and
a second container member extending in the first direction and providing a space for accommodating the second wavelength converter,
wherein each of the first container member and the second container member has a first side and a second side,
wherein the second container member is adjacent to the first container member in a second direction, crossing the first direction, the first side of the first container member and the second side of the second container member facing each other and together forming a contact surface between the first container member and the second container member, and
wherein the contact surface between the first container member and the second container member has at least a portion which is substantially no physical boundary between the first container member and the second container member.

2. The wavelength conversion member of claim 1,
wherein the contact surface between the first container member and the second container member comprises:
a first portion where there is a physical boundary between the first container member and the second container member;
a second portion where there is substantially no physical boundary between the first container member and the second container member; and
a third portion overlapping the first wavelength converter, and
wherein the first portion, the second portion, and the third portion are aligned along a third direction, crossing the first and second directions, and
a part of the first portion is located between the second portion and the third portion.

3. The wavelength conversion member of claim 2,
wherein the part of the first portion located between the second portion and the third portion has a width of 50 μm or more,
the second portion has a width of 60 μm to 120 μm,
a seed-like structure exists in the vicinity of the second portion, and
the seed-like structure has an elongated shape having a major axis and a minor axis.

4. The wavelength conversion member of claim 2,
wherein the first wavelength converter further comprises metal particles selected from aluminum oxide particles and silicon oxide particles, and
the second wavelength converter does not comprise metal particles.

5. The wavelength conversion member of claim 2,
wherein the first wavelength converter is surrounded by the first container member, and
the second wavelength converter is surrounded by the second container member.

6. The wavelength conversion member of claim 2,
wherein the first side of the first container member has a first concave groove for accommodating the first wavelength converter, and
the second side of the second container member, facing the first container member, has a second concave groove for accommodating the second wavelength converter.

7. The wavelength conversion member of claim 6,
wherein a gap is formed between the first wavelength converter and the second wavelength converter by the first and second concave grooves.

8. The wavelength conversion member of claim 2, further comprising:
a first cover member adjacent to the second side of the first container member, opposite the first side of the first container member, and sealing the first wavelength converter; and
a second cover member adjacent to the first side of the second container member, opposite the second side of the second container member, and sealing the second wavelength converter,
wherein the second side of the first container member has a first concave groove for accommodating the first wavelength converter, and
the first side of the second container member has a second concave groove for accommodating the second wavelength converter.

9. The wavelength conversion member of claim 2, further comprising:
a cover member adjacent to the second side of the first container member, opposite the first side of the first container member, and sealing the first wavelength converter,
wherein the second side of the first container member has a first concave groove for accommodating the first wavelength converter, and
the second side of the second container member, facing the first side of the first container member, has a second concave groove for accommodating the second wavelength converter, and
the second wavelength converter is surrounded by the first side of the first container member and the first side of the second container member, opposite the second side of the second container member.

10. A wavelength conversion member, comprising:
a first glass extending in a first direction and having a first side and a second side, opposite the first side;
a second glass extending in a first direction and having a first side and a second side, opposite the first side, the second glass being adjacent to the first glass in a second direction, crossing the first direction, and at least partially in direct contact with the first glass, the first side of the first glass and the second side of the second glass facing each other and together forming a contact surface between the first glass and the second glass;
a first wavelength converter interposed in the second glass adjacent to the contact surface between the first glass and the second glass, the first wavelength converter comprising a first wavelength converting material; and
a second wavelength converter interposed in the second glass adjacent to the first side of the second glass, the second wavelength converter comprising a second wavelength converting material different from the first wavelength converting material,
wherein the contact surface between the first glass and the second glass has at least a portion which is substantially no physical boundary between the first glass and the second glass.

11. The wavelength conversion member of claim 10,
wherein the first glass and the second glass are at least partially fusion-bonded with each other, and
wherein the contact surface between the first glass and the second glass comprises:
a first portion where there is a physical boundary between the first glass and the second glass;
a second portion where there is substantially no physical boundary between the first glass and the second glass; and
a third portion overlapping the first wavelength converter, and
wherein a part of the first portion is located between the second portion and the third portion.

12. The wavelength conversion member of claim 11,
wherein the first side of the first glass is substantially flat,
the second side of the second glass, facing the first glass, has a first concave groove,
the first side of the second glass has a second concave groove,
the first wavelength converter is inserted in the first concave groove, and
the second wavelength converter is inserted in the second concave groove.

13. The wavelength conversion member of claim 12,
wherein a gap is formed between the first glass and the first wavelength converter by the first concave groove.

14. The wavelength conversion member of claim 11, further comprising:
a third glass adjacent to the second wavelength converter in the second direction and at least partially in direct contact with the second glass,
wherein the first side of the first glass is substantially flat,
the second side of the second glass, facing the first glass, has a first concave groove,
a side of the third glass facing the second glass has a second concave groove, and
wherein, the first wavelength converter is inserted in the first concave groove, and
the second wavelength converter is inserted in the second concave groove.

15. The wavelength conversion member of claim 11, further comprising a third glass between the first wavelength converter and the second wavelength converter and at least partially in direct contact with the second glass,
wherein the first side of the first glass is substantially flat,
the second side of the second glass, facing the first glass, has a first concave groove,
a first side of the third glass, facing the second wavelength converter, has a second concave groove,
the first wavelength converter is inserted in the first concave groove, and
the second wavelength converter is inserted in the second concave groove.

16. The wavelength conversion member of claim 11,
wherein the first side of the first glass has a concave groove,
the second side of the second glass, facing the first glass, is substantially flat, and
the first wavelength converter is inserted in the concave groove.

17. The wavelength conversion member of claim 16,
wherein the first wavelength converter and the second glass directly face each other, but a gap is formed between the first wavelength converter and the second glass.

18. A backlight unit, comprising:
a light guide plate having a light incoming surface;
a light source adjacent to the light incoming surface of the light guide plate and configured to emit light toward the light guide plate; and
a wavelength conversion member between the light guide plate and the light source and comprising a red wavelength converter comprising a red wavelength converting material, a green wavelength converter comprising a green wavelength converting material, a first glass providing a space for accommodating the red wavelength converter, and a second glass providing a space for accommodating the green wavelength converter, the second glass being at least partially in direct contact with the first glass,
wherein light emitted from the light source sequentially passes through the red wavelength converter and the green wavelength converter to be incident on the light incoming surface,
wherein a contact surface between the first glass and the second glass has at least a portion which is substantially no physical boundary between the first glass and the second glass.

19. The backlight unit of claim 18,
wherein the second glass and the light guide plate are coupled with each other by at least partial fusion-bonding.

20. The backlight unit of claim 19,
wherein the light emitted by the light source is blue light,
the red wavelength converter further contains metal particles selected from aluminum oxide particles and silicon oxide particles, and
the green wavelength converter does not contain metal particles.

* * * * *